United States Patent
Yang et al.

(10) Patent No.: US 11,404,414 B2
(45) Date of Patent: Aug. 2, 2022

(54) INTEGRATED DEVICE COMPRISING TRANSISTOR COUPLED TO A DUMMY GATE CONTACT

(71) Applicant: QUALCOMM Incorporated, San Diego, CA (US)

(72) Inventors: Haining Yang, San Diego, CA (US); Xia Li, San Diego, CA (US); Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 99 days.

(21) Appl. No.: 16/828,487

(22) Filed: Mar. 24, 2020

(65) Prior Publication Data

US 2021/0305250 A1 Sep. 30, 2021

(51) Int. Cl.
*H01L 27/092* (2006.01)
*H01L 21/8238* (2006.01)
*H01L 29/40* (2006.01)

(52) U.S. Cl.
CPC .... *H01L 27/0922* (2013.01); *H01L 21/82385* (2013.01); *H01L 21/823871* (2013.01); *H01L 27/0924* (2013.01); *H01L 29/402* (2013.01)

(58) Field of Classification Search
CPC ......... H01L 21/823871; H01L 27/0922; H01L 27/0924; H01L 29/42312; H01L 29/42372
See application file for complete search history.

(56) References Cited

U.S. PATENT DOCUMENTS

| | | | |
|---|---|---|---|
| 9,964,605 B2 | 5/2018 | Chi et al. | |
| 2002/0153537 A1* | 10/2002 | Segawa | H01L 21/76897 257/E21.507 |
| 2008/0116515 A1* | 5/2008 | Gossner | H01L 23/367 257/E29.264 |
| 2015/0014781 A1 | 1/2015 | Shimbo et al. | |
| 2016/0336183 A1 | 11/2016 | Yuan et al. | |
| 2017/0221821 A1 | 8/2017 | Hu et al. | |

(Continued)

FOREIGN PATENT DOCUMENTS

| | | |
|---|---|---|
| CN | 105355602 B | 9/2018 |
| EP | 3264473 A1 | 1/2018 |

(Continued)

OTHER PUBLICATIONS

Fink D., et al., "Tunable electronically anisotropic materials with ion-irradiated polysilanes on semiconductor," Applied Physics A—Materials Science & Processing, vol. 86, Jan. 2007, pp. 469-476.

(Continued)

*Primary Examiner* — Bryan R Junge
(74) *Attorney, Agent, or Firm* — Loza & Loza, LLP/Qualcomm

(57) ABSTRACT

An integrated device that includes a substrate, a first transistor located over the substrate, where the first transistor includes a gate. The integrated device includes a first gate contact coupled to the gate of the first transistor, where the first gate contact is configured to be electrically coupled to an interconnect of the integrated device. The integrated device includes a second gate contact coupled to the gate, where the second gate contact is directly electrically coupled to only the gate.

34 Claims, 21 Drawing Sheets

(56) References Cited

U.S. PATENT DOCUMENTS

| | | |
|---|---|---|
| 2017/0365657 A1 | 12/2017 | Chen et al. |
| 2018/0350802 A1 | 12/2018 | Lee et al. |
| 2019/0057962 A1 | 2/2019 | Lu et al. |
| 2019/0304900 A1 | 10/2019 | Chen et al. |
| 2021/0035902 A1* | 2/2021 | Kang .................. H01L 27/0924 |
| 2021/0175232 A1* | 6/2021 | Nam ................... H01L 29/4232 |

FOREIGN PATENT DOCUMENTS

| | | |
|---|---|---|
| JP | 2011146478 A | 7/2011 |
| WO | 2017106575 A2 | 6/2017 |

OTHER PUBLICATIONS

Lee M.S., et al., "Dummy Gate-Assisted n-MOSFET Layout for a Radiation-Tolerant Integrated Circuit," IEEE Transactions on Nuclear Science, Aug. 2013, vol. 60, No. 4, pp. 3084-3091.
International Search Report and Written Opinion—PCT/US2021/023505—ISA/EPO—dated Jul. 15, 2021.

* cited by examiner

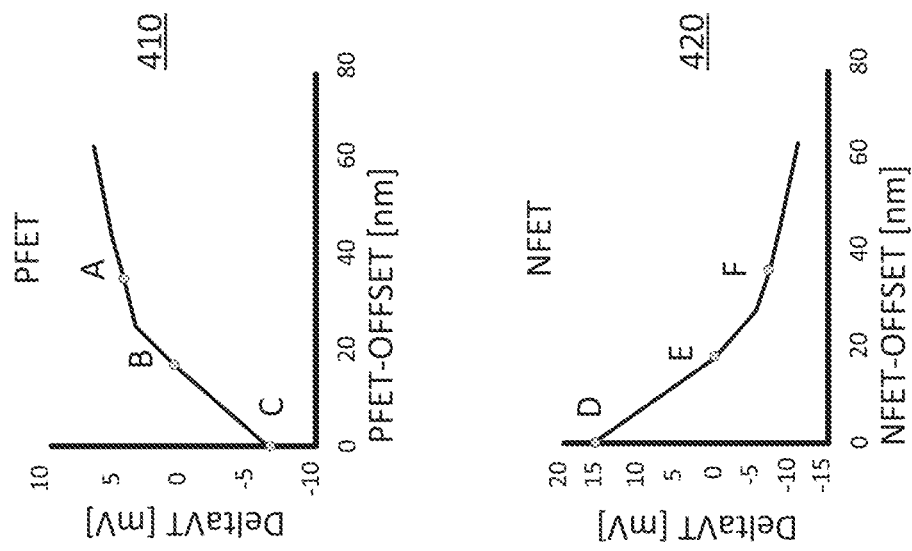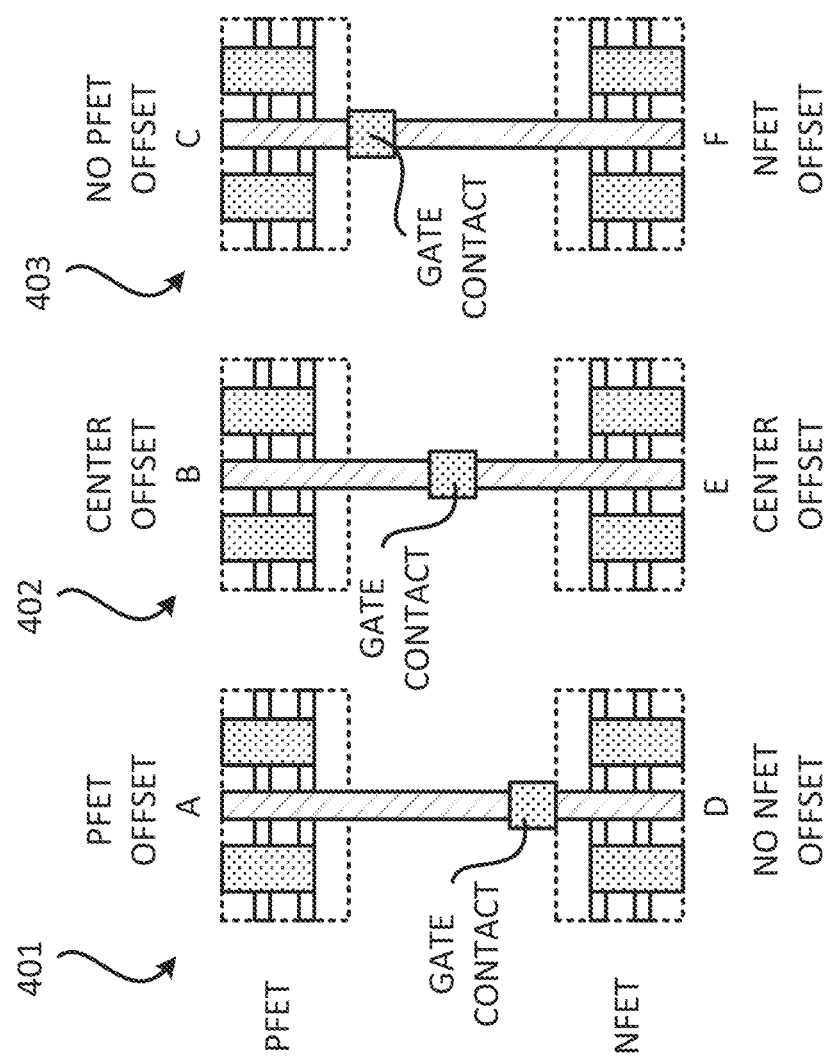
FIG. 4

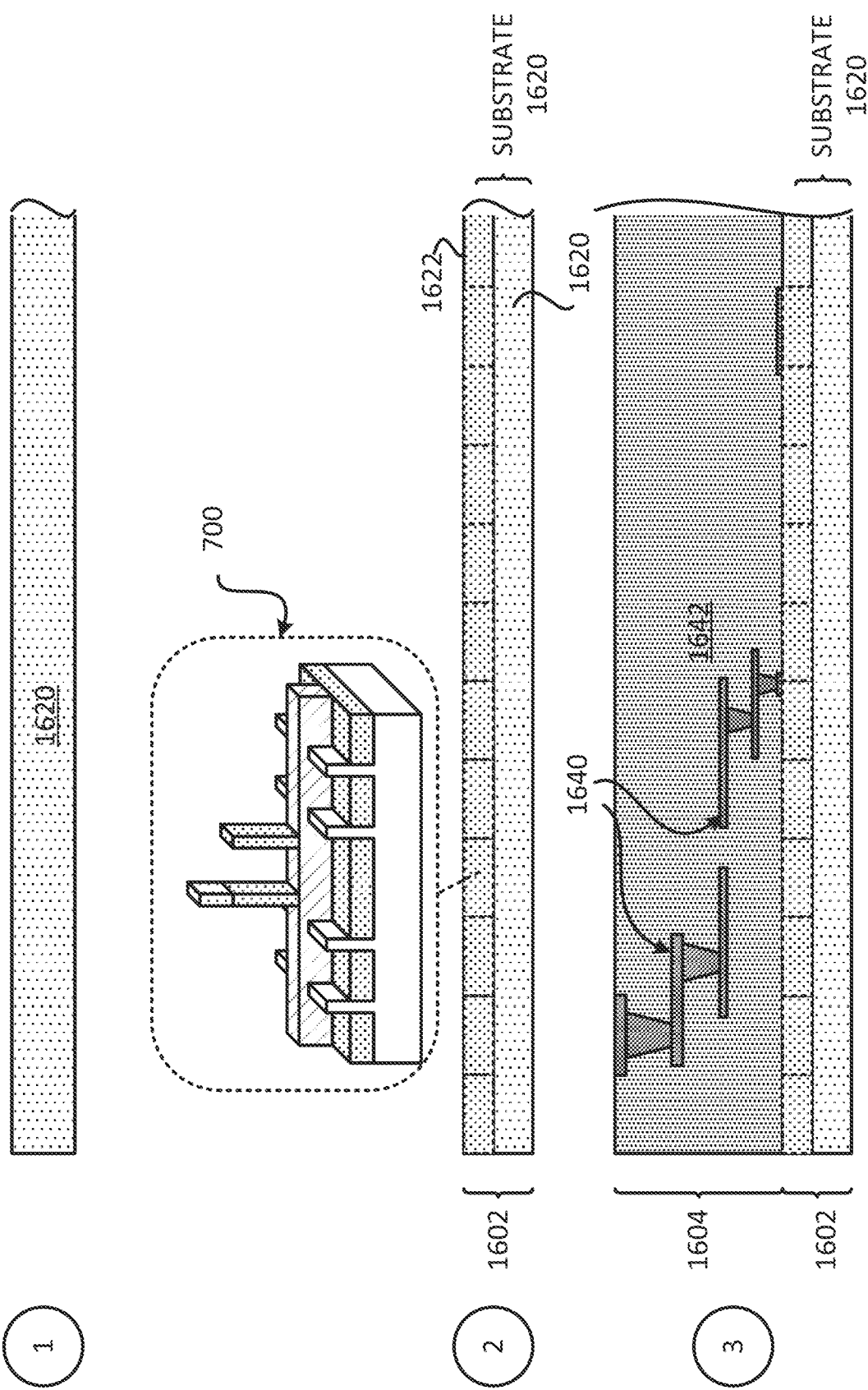

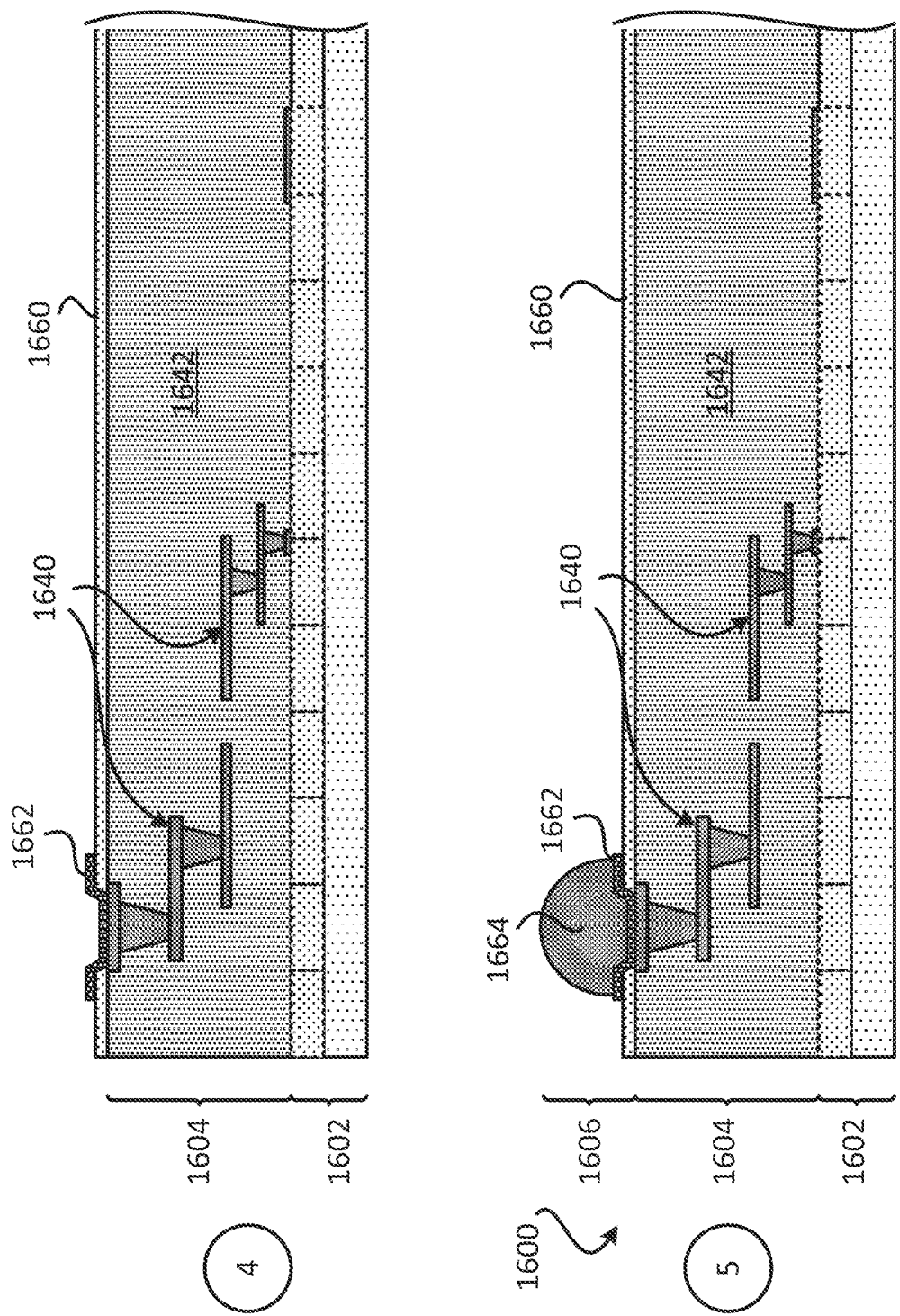

INTEGRATED DEVICE COMPRISING TRANSISTOR COUPLED TO A DUMMY GATE CONTACT

FIELD

Various features relate to transistors, but more specifically to integrated device comprising a transistor coupled to a dummy gate contact.

BACKGROUND

FIG. 1 illustrates a planar field effect transistor (FET) 100. The FET 100 is formed over a substrate 102 and an oxide 104. The FET 100 includes a source 106, a drain 108 and a gate 110. The source 106 and the drain 108 are located over the substrate 102. When a minimum voltage is applied between the gate 110 and the substrate 102, a current may flow between the source 106 and the drain 108. There is an ongoing need to improve the performance of transistors, such as being able to better control when a current flows between a source and a drain of a transistor.

SUMMARY

Various features relate to transistors, but more specifically to integrated device comprising a transistor coupled to a dummy gate contact.

One example provides an integrated device that includes a substrate, a first transistor located over the substrate, where the first transistor includes a gate. The integrated device includes a first gate contact coupled to the gate of the first transistor, where the first gate contact is configured to be electrically coupled to an interconnect of the integrated device. The integrated device includes a second gate contact coupled to the gate, where the second gate contact is directly electrically coupled to only the gate.

Another example provides an apparatus that includes a substrate, a first transistor located over the substrate, where the first transistor comprises a gate. The apparatus includes a first gate contact coupled to the gate of the first transistor, where the first gate contact is configured to be electrically coupled to an interconnect of the integrated device. The apparatus includes means for tuning a voltage required to induce a first current flow in the first transistor, where the means for tuning is directly electrically coupled to only the gate.

Another example provides an integrated device that includes a substrate, a first transistor located over the substrate, where the first transistor comprises a gate. The integrated device includes a first gate contact coupled to the gate of the first transistor, where the first gate contact is configured to be electrically coupled to an interconnect of the integrated device. The integrated device includes a second gate contact coupled to the gate, and a contact interconnect coupled to the second gate contact, where the contact interconnect is directly electrically coupled to only the gate contact.

Another example provides a method for fabricating an integrated device. The method provides a substrate. The method forms a first transistor over the substrate, wherein the first transistor comprises a gate. The method forms a first gate contact over the gate of the first transistor, wherein the first gate contact is configured to be electrically coupled to an interconnect of the integrated device. The method forms a second gate contact over the gate, wherein the second gate contact is directly electrically coupled to only the gate.

BRIEF DESCRIPTION OF THE DRAWINGS

Various features, nature and advantages may become apparent from the detailed description set forth below when taken in conjunction with the drawings in which like reference characters identify correspondingly throughout.

FIG. 4 illustrates examples of various positions of a gate contact with respect to a transistor.

FIG. 17 (comprising FIGS. 17A-17B) illustrates an exemplary sequence for fabricating an integrated device that includes a transistor coupled to a dummy gate contact.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an integrated device that includes a substrate, a first transistor located over the substrate, wherein the first transistor includes a gate. The integrated device includes a first gate contact coupled to the gate of the first transistor, wherein the first gate contact is configured to be electrically coupled to an interconnect of the integrated device. The integrated device includes a second gate contact coupled to the gate, where the second gate contact is directly electrically coupled to only the gate. The integrated device may include a second transistor located over the substrate, where the second transistor includes the gate. The second gate contact is configured to tune (e.g., reduce) a threshold voltage required to induce a first current flow in the first transistor and a second current flow in the second transistor. The first transistor may be a p-channel field effect transistor (PFET) and the second transistor may be a n-channel field effect transistor (NFET). Integrated devices in a device may operate under different operational conditions, and as such, the ability to tune the threshold voltage required to induce a current in one or more transistors may help optimize the performance of the integrated device for the device.

Exemplary Transistor Coupled to Gate Contact and Dummy Gate Contact

Figure 1:
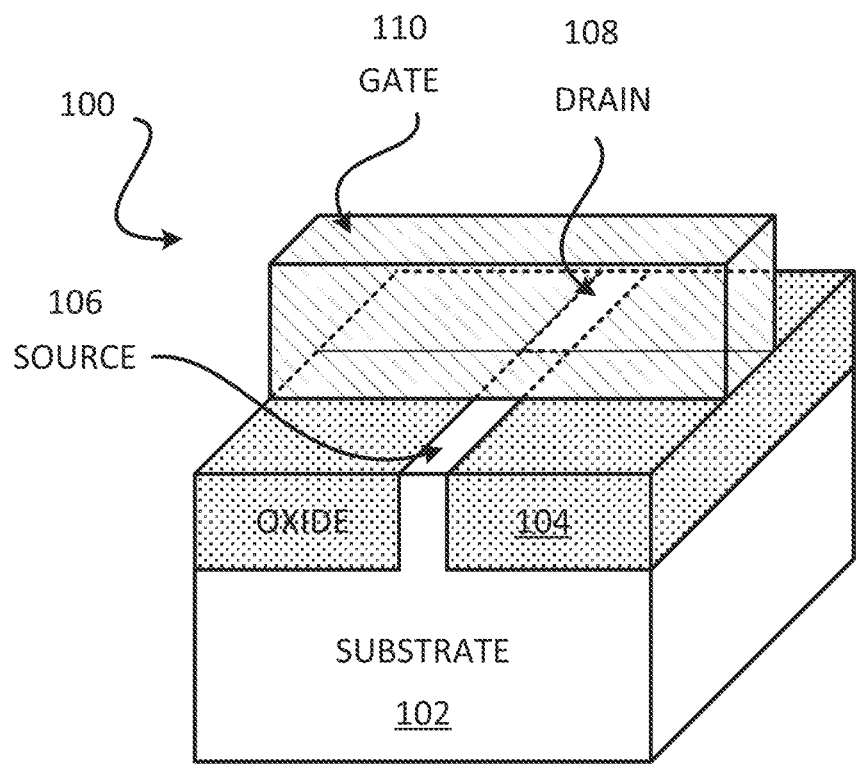
FIG. 1 illustrates a planar field effect transistor (FET).
Figure 2:
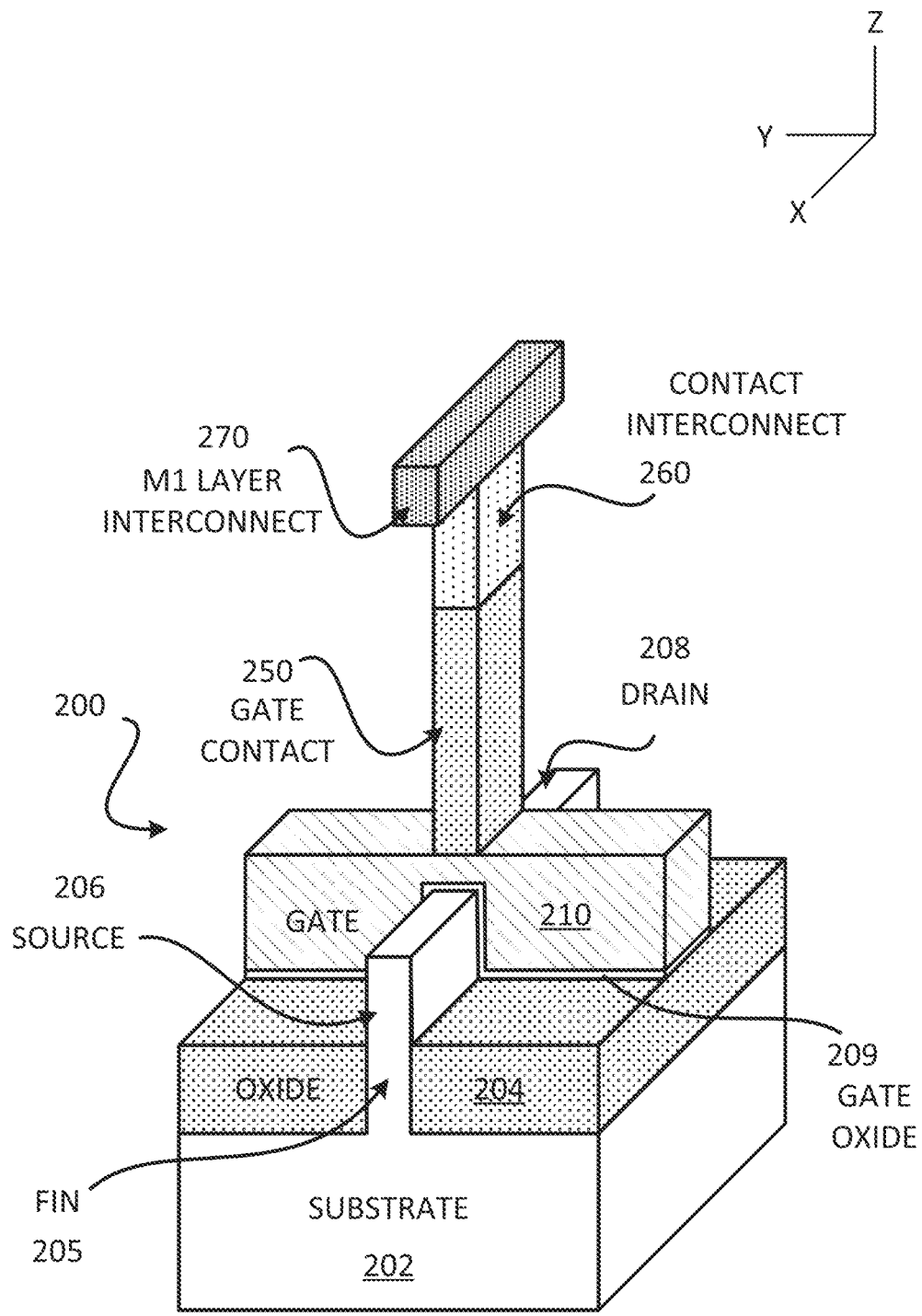
FIG. 2 illustrates an example of a fin field effect transistor (FET) coupled to the gate contact.

FIG. 2 illustrates an example of transistor 200 that is formed in an integrated device. The transistor 200 may include a fin field effect transistor (FET). The transistor 200 includes a substrate 202, an oxide 204, a fin 205, a source 206, a drain 208, a gate oxide 209, and a gate 210. The oxide 204 is located over the substrate 202. The source 206 may be a part of the fin 205 that is configured as a source for the transistor 200. The drain 208 may be a part of the fin 205 that is configured as a drain for the transistor 200. The fin 205 is located over the substrate 202. The fin 205 may be part of the substrate 202. The fin 205 may be located at least partially in the oxide 204. The source 206 may be defined by a first portion of the fin 205, and the drain 208 may be defined by a second portion of the fin 205. The gate oxide 209 is located over the oxide 204 and the fin 205. The gate 210 is located over the oxide 204 and the fin 205. The gate oxide 209 may be located between the gate 210 and the oxide 204 and the fin 205. Although not shown, the substrate 202 may include wells that are doped with a N dopant or a P dopant. The type of dopant that is used in the wells may specify whether the transistor 200 is a N type transistor or a P type transistor.

A gate contact 250 is coupled to the transistor 200. In particular, the gate contact 250 is coupled to the gate 210 of the transistor 200. A contact interconnect 260 is coupled to the gate contact 250. An interconnect 270 (e.g., M1 layer interconnect of an integrated device) may be coupled to the contact interconnect 260.

When a voltage is applied between the gate 210 and the substrate 202, a current may be induced to flow between the source 206 and the drain 208. The voltage may be applied to the gate 210 through the interconnect 270, the contact interconnect 260 and the gate contact 250. The gate contact 250 may be a driving gate contact, where a voltage is applied. The transistor 200 may require a threshold voltage (Vt) to be applied to the gate 210 in order for a current to flow between the source 206 and the drain 208. The threshold voltage may be a minimum voltage. In some implementations, the minimum voltage that is applied to a gate (e.g., gate 210) may be equal or greater than the threshold voltage for the gate. As will be further described below, one or more transistors of an integrated device, may be configured in such a way as to require a low threshold voltage in order to induce a current flow in the one or more transistors. Similarly, one or more transistors of an integrated device, may be configured in such a way as to require a high threshold voltage in order to induce a current flow in the one or more transistors.

Figure 3:
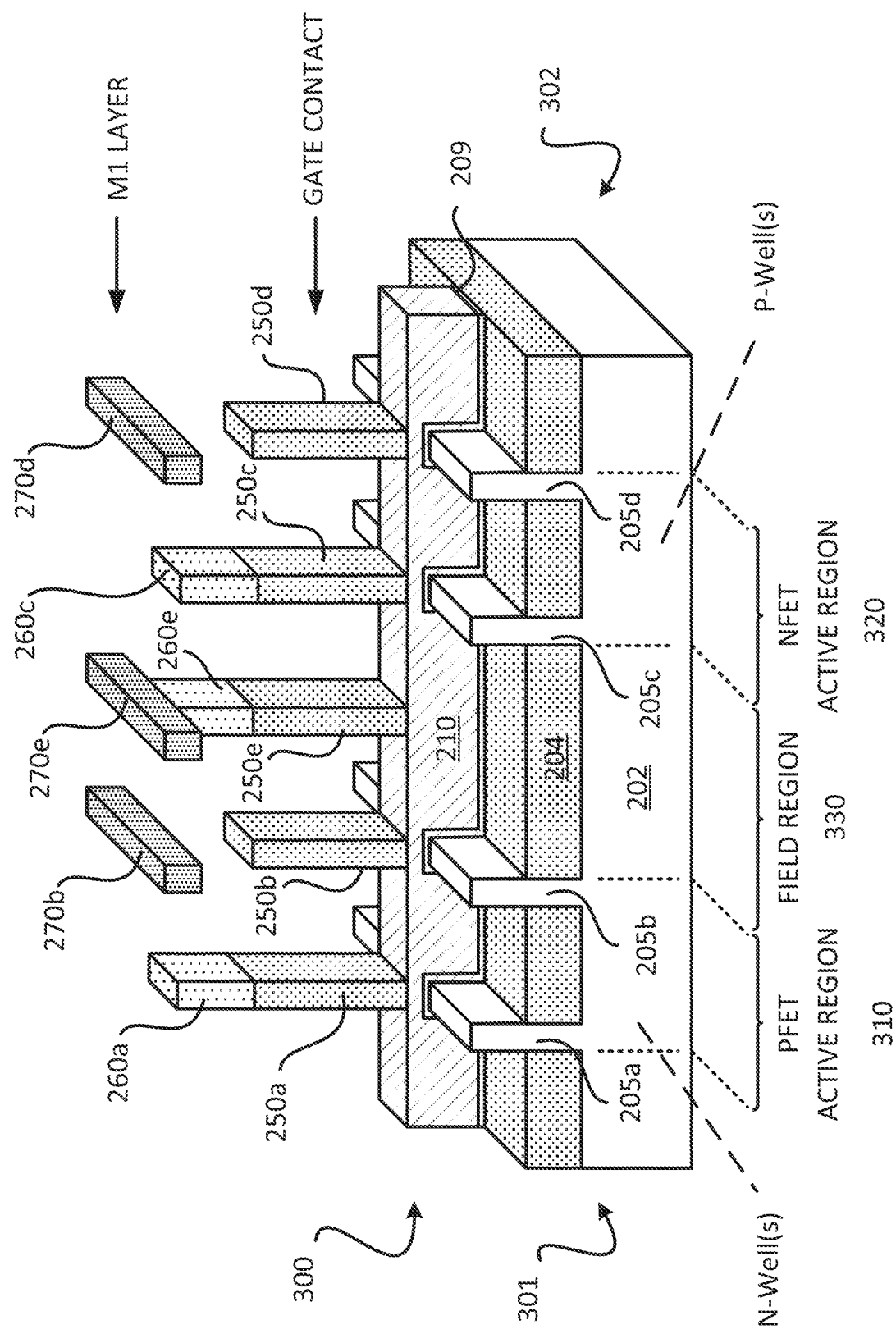
FIG. 3 illustrates an example of a finFET that is coupled to at least one dummy gate contact.

FIG. 3 illustrates a structure 300 that includes a first transistor 301 and a second transistor 302. The structure 300 may be implemented in an integrated device. The structure 300 may be part of a device level cell of an integrated device.

The structure 300 includes the substrate 202, the oxide 204, the plurality of fins 205. The gate oxide 209 and the gate 210. The plurality of fins 205 includes fins (e.g., 205a, 205b, 205c, 205d). Each of the fins from the plurality of fins 205 may include a respective source and a respective drain, as described in FIG. 2.

The first transistor 301 includes the substrate 202, the oxide 204, the fin 205a, the fin 205b, the gate oxide 209, and the gate 210. The fin 205a may have a source and a drain. Similarly, the fin 205b may have a source and a drain. The second transistor 302 includes the substrate 202, the oxide 204, the fin 205c, the fin 205d, the gate oxide 209, and the gate 210. The fin 205c may have a source and a drain. Similarly, the fin 205d may have a source and a drain. In this example, the first transistor 301 and the second transistor 302 share the same gate (e.g., 210). However, in some implementations, the first transistor 301 and the second transistor 302 may have different gates. It is noted that for the purpose of clarity not all components may be shown in FIG. 3. For example, there may be dielectric layer(s) that are formed over and/or around the fins 205, the gate 210, the gate contact 250, the contact interconnect 260 and/or the interconnect 270.

FIG. 3 illustrates a p-channel field effect transistor (PFET) active region 310, a n-channel field effect transistor (NFET) active region 320 and a field region 330. The field region 330 is located between the PFET active region 310 and the NFET active region 320. Although not shown, the substrate 202 may include wells that are doped with a N dopant or a P dopant. The type of dopant that is used in the wells may specify whether the transistor is a N type transistor or a P type transistor. The PFET active region 310 may include a portion of the substrate 202 that includes one or more wells with N dopant. The NFET active region 320 may include a portion of the substrate 202 that includes one or more wells with P dopant. The first transistor 301 includes the PFET active region 310 and/or is located in the PFET active region 310. The first transistor 301 may be configured as a p-type metal oxide semiconductor (PMOS) transistor. The second transistor 302 includes the NFET active region 320 and/or is located in the NFET active region 320. The second transistor 302 may be configured as a n-type metal oxide semiconductor (NMOS) transistor. The first transistor 301 and the second transistor 302 each are defined by two find (e.g., first fin, second fin). However, different implementations may define transistors with a different number of fins (e.g., one or more fins).

FIG. 3 illustrates several gate contacts coupled to the gate 210. In particular, the gate contact 250a, the gate contact 250b, the gate contact 250c, the gate contact 250d, and the gate contact 250e are coupled to the gate 210 (e.g. to different portions of the gate 210). The gate contact 250a and the gate contact 250b are located over the PFET active region 310. In particular, the gate contact 250a is located over the fin 205a and the gate contact 250b is located over the fin 205b. The gate contact 250c and the gate contact 250d are located over the NFET active region 320. In particular, the gate contact 250c is located over the fin 205c, and the gate contact 250d is located over the fin 205d. The gate contact 250e is located over the field region 330. A contact interconnect 260e is coupled to the gate contact 250e. In some implementations, the contact interconnect 260e may be considered part of the gate contact 250e. An interconnect 270e is coupled to the contact interconnect 260e. In some implementations, the interconnect 270e may be coupled directly to the gate contact 250e. A gate contact (e.g., 250) may be configured to be electrically coupled to an interconnect (e.g., interconnect of M1 metal layer) of an integrated device.

A voltage may be applied to the gate 210 through the interconnect 270e, the contact interconnect 260e and the gate contact 250e. The gate contact 250e may be a driving gate contact, where a voltage is applied. When a threshold voltage (Vt) is applied between the gate 210 and the substrate 202, a first current may flow through a source and drain (as defined by the fins 205a and 205b) of the first transistor 301, and a second current may flow through a source and drain (as defined by the fins 205c and 205d) of the second transistor 302. As mentioned above, the first transistor 301 may operate as a different transistor than the second transistor 302. Thus, each transistor may need a different threshold voltage in order to induce a current flow. In some implementations, to induce a current flow in both transistors, the voltage that is provided at the gate 210 must be the higher of the threshold voltages for the first transistor 301 and the second transistor 302.

It is possible to tune and/or adjust the threshold voltage required to induce a current flow by positioning where the gate contact is coupled to the gate 210, and/or coupling one or more dummy gate contacts (e.g., and/or dummy contact interconnects). In the example of FIG. 3, the gate contact 250e is located approximately in the center of the field region 330. However, in other implementations, the gate contact 250e may be located in a different portion of the field region 330. FIG. 3 illustrates that the gate contact 250e is the driving gate contact. However, different implementations may use any of the gate contacts as the driving gate contact. FIG. 3 illustrates that some of the gate contacts (e.g., 250a, 250b, 250c, 250d) that are coupled (e.g., directly coupled) to the gate 210 are not directly coupled to other interconnects. That is, these gate contacts are only directly coupled to the gate 210 and are not directly coupled to other interconnects (e.g., contact interconnect 260, interconnect 270). These gate contacts (e.g., 250a, 250b, 250c, 250d) may be considered as dummy gate contacts. Interconnects (e.g., 270b, 270d) may be located over some of all of the gate contacts (e.g., 250a, 250b, 250c, 250d). A contact interconnect 260a and a contact interconnect 260c are respectively coupled to the gate contact 250a and the gate contact 250c. However, the contact interconnect 260a and the contact interconnect 260c are not directly coupled to another interconnects (e.g., interconnects on M1 layer). Although the gate contact 250a and the gate contact 250c are coupled to respective contact interconnect 260a and contact interconnect 260c, the gate contact 250a and the gate contact 250c may each be considered as a dummy gate contact. The gate contact 250a and the gate contact 250c may each be considered as a dummy gate contact because they each are not a driving gate contact. In some implementations, the contact interconnect 260a is considered part of the gate contact 250a, and the contact interconnect 260c is considered part of the gate contact 250c.

As will be further described below, the formation or process of fabricating the gate contact(s) (e.g., dummy gate contact(s)) may cause ions (e.g., oxygen ions) to diffuse into the gate and/or fins, which changes the work metal function of the transistor, and thus tunes the drive strength and/or voltage threshold of the transistor. For example, forming at least one gate contact (e.g., dummy gate contact) closer to a PFET may result in more ions to be diffused into the PFET than the NFET. Forming at least one gate contact (e.g., dummy gate contact) closer to a NFET may result in more ions being diffused into the NFET than the PFET. The at least one dummy gate contact may be means for tuning a voltage required to induce a current flow (e.g., first current flow, second current flow) in at least one transistor (e.g., first transistor, second transistor).

The dummy gate contacts (e.g., 250a, 250b, 250c, 250d) are coupled (e.g., directly coupled) to different portions of the gate 210 in order to tune (e.g., reduce, increase) the threshold voltage required to induce a flow of current in the first transistor 301 and/or the second transistor 302. In the example of FIG. 3, there are four dummy gate contacts. However, as will be further described below, different implementations may have different numbers of dummy gate contacts. Moreover, the position of the dummy gate contacts may vary with different implementations. Different implementations may have different dimensions for the fins, the gate contact(s) and/or the gate. For example, in some implementations, a fin (e.g., 205a, 205b, 205c, 205d) may have a fin width that is approximately 4 to 10 nanometers (nm). In some implementations, a gate (e.g., 210) may have a length of approximately 8 to 14 nanometers (nm). In some implementations, a gate contact (e.g., 250a, 250b, 250c, 250d) may have lateral dimensions (e.g., along X-axis and Y-axis) of approximately 15 to 25 nanometers (nm). However, different implementations may have different dimensions for the fins, the gate contacts and/or the gate.

FIG. 4 illustrates three examples of how the position of gate contact may affect the threshold voltage (Vt) required to induce a current in a PFET and a NFET. FIG. 4 illustrates (i) a first configuration 401, where the gate contact is located close to the NFET and offset from the PFET, (ii) a second configuration 402, where the gate contact is located halfway between the PFET and the NFET, and (iii) a third configuration 403, where the gate contact is located close to the PFET and offset from the NFET.

As shown in graph 410, when the gate contact is close to the PFET (C), the threshold voltage required to induce a current flow in the PFET is reduced by approximately 7 millivolts (mV). When the gate contact is between the PFET and the NFET (B), the threshold voltage required to induce a current flow in the PFET does not change much. When the gate contact is close to the NFET (A) and offset from the PFET, the threshold voltage required to induce a current flow in the PFET is increased by approximately 4 millivolts (mV).

As shown in graph 420, when the gate contact is close to the NFET (D), the threshold voltage required to induce a current flow in the NFET is increased by approximately 15 millivolts (mV). When the gate contact is between the PFET and the NFET (E), the threshold voltage required to induce a current flow in the PFET does not change much. When the gate contact is close to the PFET (F) and offset from the NFET, the threshold voltage required to induce a current flow in the PFET is reduced by approximately 7 millivolts (mV).

The placement of the gate contact is important because the formation or process of fabricating the gate contact(s) may cause ions (e.g., oxygen ions) to diffuse into the gate and/or fins, which changes the work metal function of the transistor, and thus tunes the drive strength and/or voltage threshold of the transistor. A gate contact that is closer to a PFET may result in more ions being diffused in the PFET than in the NFET. A gate contact that is closer to a NFET may result in more ions being diffused in the NFET than in the PFET.

Thus, as shown in graphs 410 and 420, positioning the gate contact closer to the PFET reduces the threshold voltage required to induce a current flow in both the PFET and the NFET. This means that positioning the gate contact closer to the PFET increases the driving strength of the PFET and NFET. In contrast, positioning the gate contact closer to the NFET increases the threshold voltage required to induce a current flow in both the PFET and the NFET. This means that positioning the gate contact closer to the PFET decreases the driving strength of the PFET and NFET.

To further tune the transistor, change the drive strength of the gate contact and/or change the threshold voltage of the transistor, dummy gate contacts may be coupled to the gate. The placement and formation of at least dummy gate contact over the gate may cause additional ions (e.g., oxygen ions) to diffuse into the gate and/or fins. The above diffusion of ions may be referred to as a metal gate function change from a gate contact and/or a dummy gate contact etching process, which is further described below in at least FIG. 13C. For example, forming at least one gate contact (and/or at least one dummy gate contact) closer to a PFET may result in more ions to be diffused into the PFET than the NFET. Forming at least one gate contact (and/or at least one dummy gate contact) closer to a NFET may result in more ions being diffused into the NFET than into the PFET. As mentioned above, at least one dummy gate contact may be means for tuning a threshold voltage required to induce a current flow in the transistor.

FIGS. 5-11 illustrate various examples of how gate contacts and/or dummy gate contacts may be coupled to a gate. It is noted that the examples shown in FIGS. 3 and 5-11 are not limiting, and other implementations may include other configurations. As shown below, the forming of a dummy gate contact may result in more ions being diffused into a NFET and/or PFET, which tunes the transistor(s), changes the driving strength of the gate contact and/or changes the threshold voltage of the transistor(s). How much ions are diffused into the NFET and/or the PFET may depend on the location and size of the gate contact and/or dummy gate contact, as well as the number of dummy gate contact. For example, more dummy gate contacts may mean more ions being diffused. Larger sized gate contact(s) and/or dummy gate contacts may mean more ions being diffused.

Figure 5:
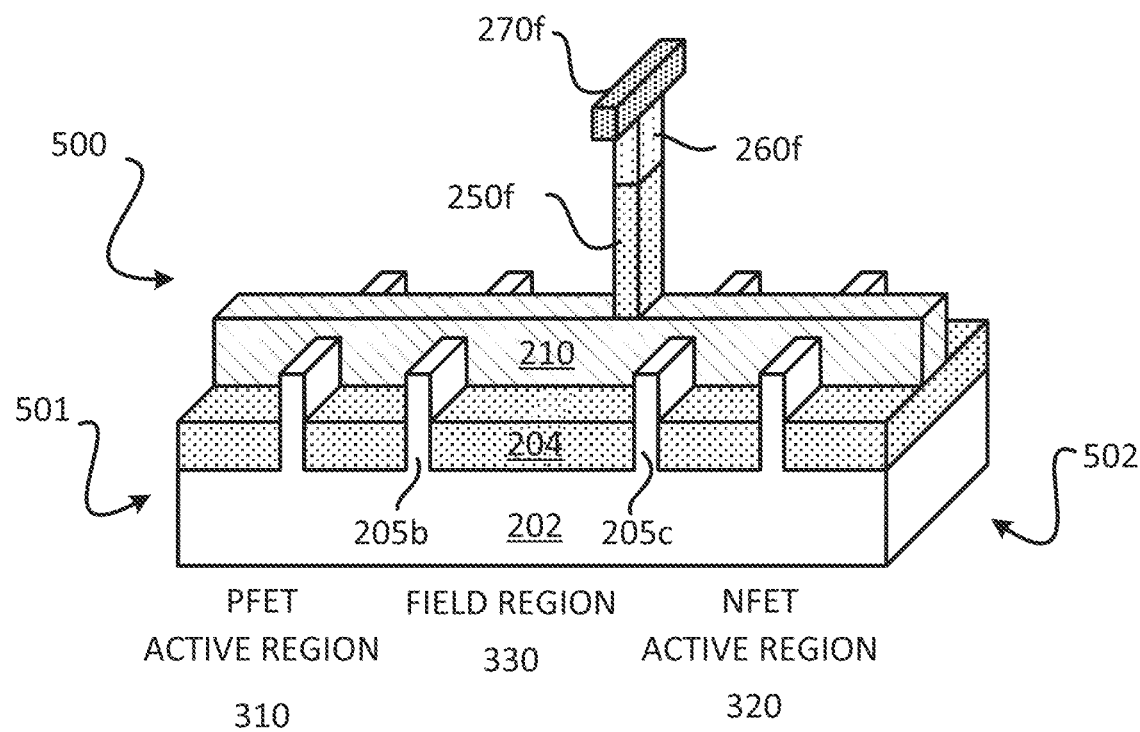
FIG. 5 illustrates an example of a finFET that is coupled to a gate contact.

FIG. 5 illustrates a structure 500 that includes a first transistor 501 and a second transistor 502. The structure 500 is similar to the structure 300 and includes the same or similar components as the structure 300. The first transistor 501 is similar to the first transistor 301, and includes similar components as the first transistor 301. The second transistor 502 is similar to the second transistor 302, and includes similar components as the second transistor 302. FIG. 5 illustrates a gate contact 250f that is coupled to a portion of the gate 210 that is close to the fin 205c. The gate contact 250f is located in the field region 330 between the PFET active region 310 and the NFET active region 320. The contact interconnect 260f is coupled to the gate contact 250f. The interconnect 270f is coupled to the contact interconnect 260f.

Figure 6:
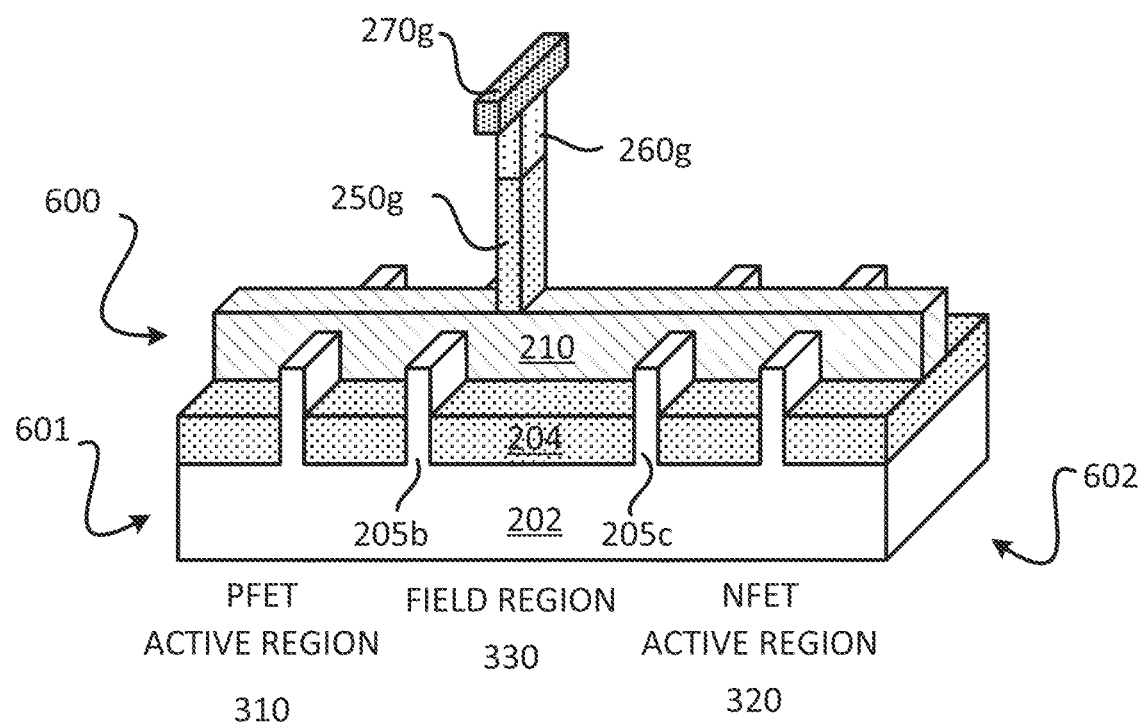
FIG. 6 illustrates an example of a finFET that is coupled to a gate contact.

FIG. 6 illustrates a structure 600 that includes a first transistor 601 and a second transistor 602. The structure 600 is similar to the structure 300 and includes the same or similar components as the structure 300. The first transistor 601 is similar to the first transistor 301, and includes similar components as the first transistor 301. The second transistor 602 is similar to the second transistor 302, and includes similar components as the second transistor 302. FIG. 6 illustrates a gate contact 250g that is coupled to a portion of the gate 210 that is close the fin 205b. The gate contact 250g is located in the field region 330 between the PFET active region 310 and the NFET active region 320. The contact interconnect 260g is coupled to the gate contact 250g. The interconnect 270g is coupled to the contact interconnect 260g.

Figure 7:
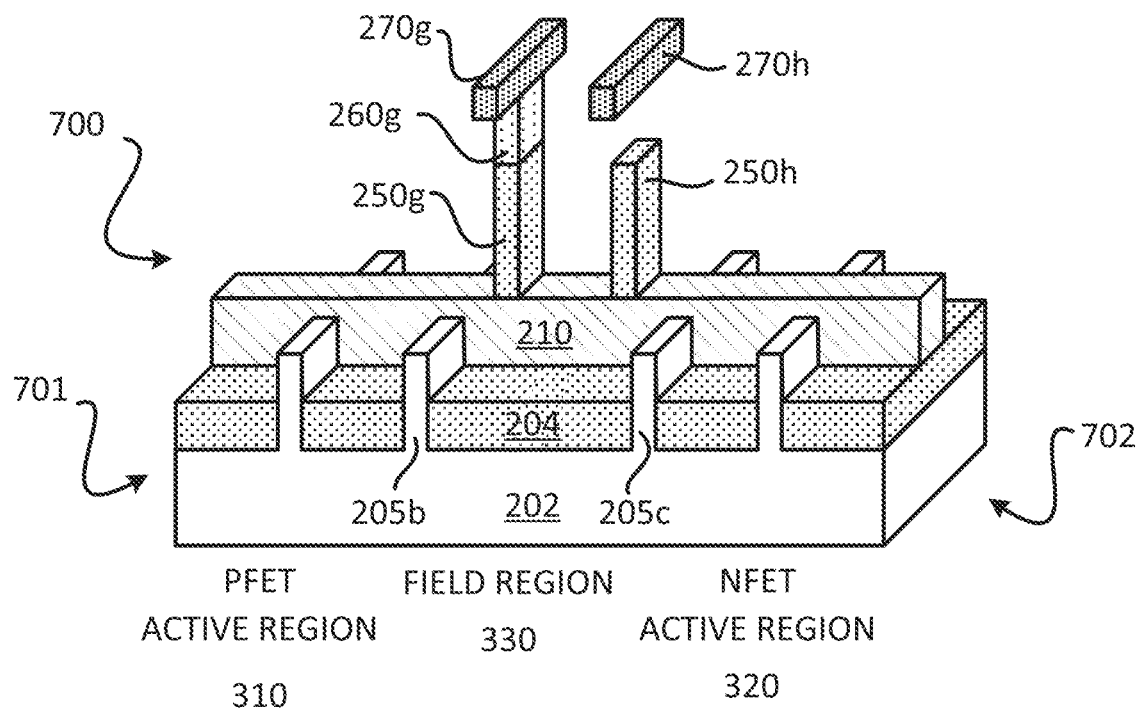
FIG. 7 illustrates an example of a finFET that is coupled to a gate contact and a dummy gate contact.

FIG. 7 illustrates a structure 700 that includes a first transistor 701 and a second transistor 702. The structure 700 is similar to the structure 300 and includes the same or similar components as the structure 300. The first transistor 701 is similar to the first transistor 301, and includes similar components as the first transistor 301. The second transistor 702 is similar to the second transistor 302, and includes similar components as the second transistor 302. FIG. 7 illustrates a gate contact 250g that is coupled to a portion of the gate 210 that is close to the fin 205b. A gate contact 250h is coupled to another portion of the gate 210 that is close to the fin 205c. The gate contact 250h may be a dummy gate contact. The gate contact 250g and the gate contact 250h are located in the field region 330 between the PFET active region 310 and the NFET active region 320. The contact interconnect 260g is coupled to the gate contact 250g. The interconnect 270g is coupled to the contact interconnect 260g. The gate contact 250h is directly coupled (e.g., directly electrically coupled) to only the gate 210, which may mean that the gate contact 250h is free of direct coupling (e.g., free of direct electrical coupling) with other interconnects. An interconnect 270h may be located over the gate contact 250h. The gate contact 250h may not be used as driving gate contact.

Figure 8:
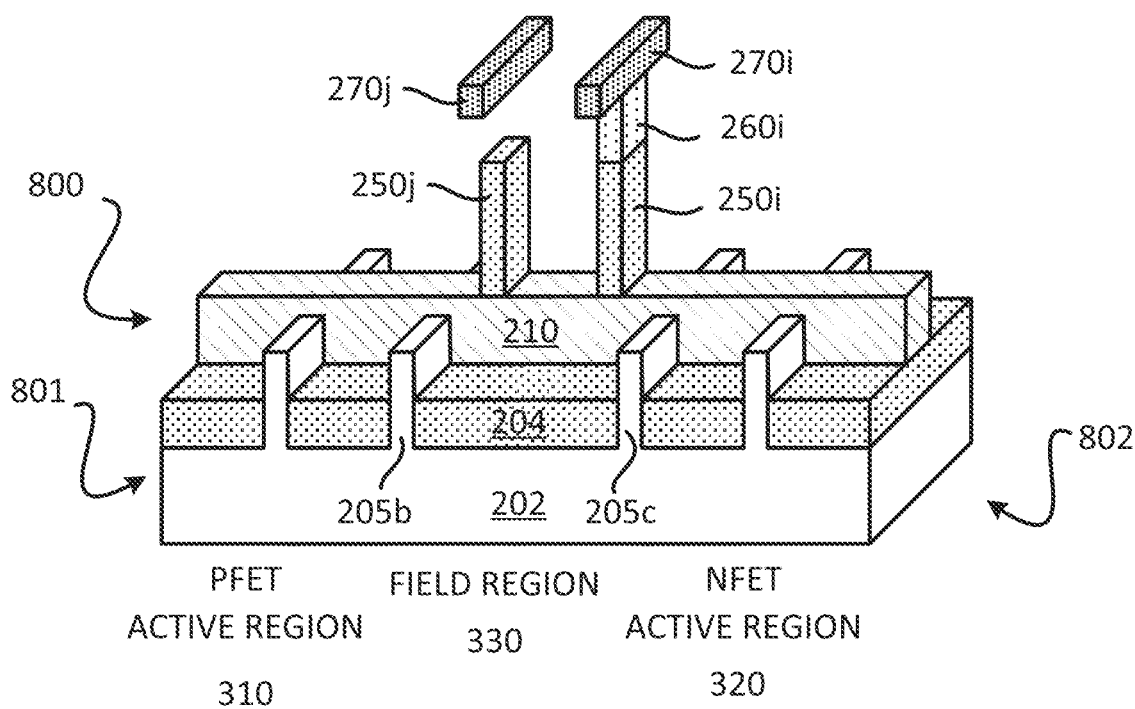
FIG. 8 illustrates an example of a finFET that is coupled to a gate contact and a dummy gate contact.

FIG. 8 illustrates a structure 800 that includes a first transistor 801 and a second transistor 802. The structure 800 is similar to the structure 300 and includes the same or similar components as the structure 300. The first transistor 801 is similar to the first transistor 301, and includes similar components as the first transistor 301. The second transistor 802 is similar to the second transistor 302, and includes similar components as the second transistor 302. FIG. 8 illustrates a gate contact 250i that is coupled to a portion of the gate 210 that is close the fin 205c. A gate contact 250j is coupled to another portion of the gate 210 that is close to the fin 205b. The gate contact 250j may be a dummy gate contact. The gate contact 250i and the gate contact 250j are located in the field region 330 between the PFET active region 310 and the NFET active region 320. The contact interconnect 260i is coupled to the gate contact 250i. The interconnect 270i is coupled to the contact interconnect 260i. The gate contact 250j is directly coupled (e.g., directly electrically coupled) to only the gate 210 and is free of direct coupling (e.g., free of direct electrical coupling) with other interconnects. An interconnect 270j may be located over the gate contact 250h.

Figure 9:
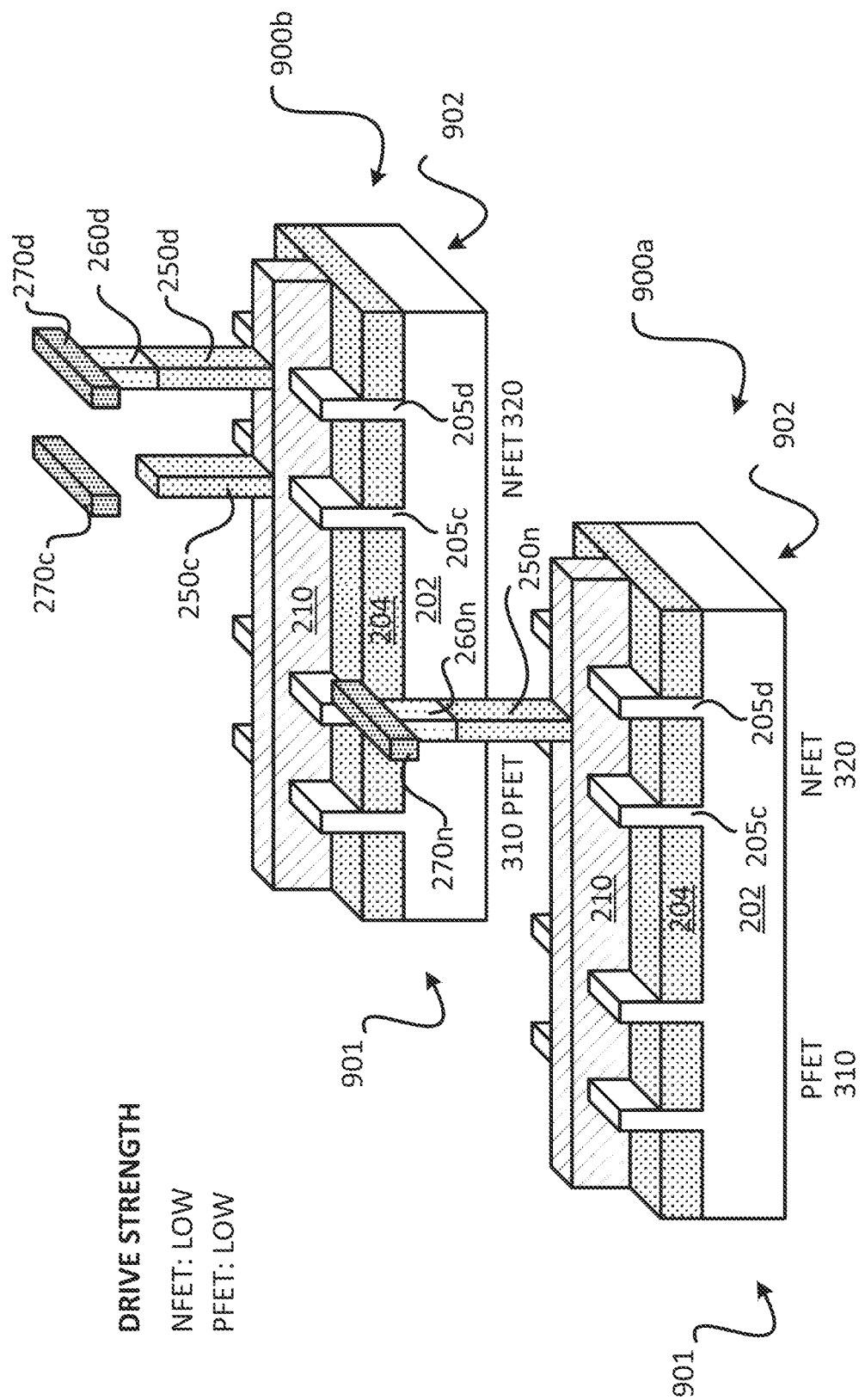
FIG. 9 illustrates an example of finFETs that are coupled to a gate contact and a dummy gate contact.

FIG. 9 illustrates a structure 900a and a structure 900b that each includes a first transistor 901 and a second transistor 902. The first transistor 901 is similar to the first transistor 301, and includes similar components as the first transistor 301. The second transistor 902 is similar to the second transistor 302, and includes similar components as the second transistor 302. FIG. 9 illustrates examples of structures that have low drive strengths (e.g., high threshold voltage (Vt)) for the NFET and the PFET.

FIG. 9 illustrates a gate contact 250n that is coupled to a portion of the gate 210 that is between the fin 205c and the fin 205d of the structure 900a. The gate contact 250n is located over the NFET active region 320. The contact interconnect 260n is coupled to the gate contact 250n. The interconnect 270n is coupled to contact interconnect 260n.

FIG. 9 illustrates (i) a gate contact 250c that is coupled to a portion of the gate 210 that is above the fin 205c of the structure 900b, (ii) a gate contact 250d that is coupled to a portion of the gate 210 that is above the fin 205d of the structure 900b. The gate contact 250c and the gate contact 250d are located in the NFET active region 320. The gate contact 250c is a dummy gate. The contact interconnect 260d is coupled to the gate contact 250d. The interconnect 270d is coupled to contact interconnect 260d. In some implementations, the gate contact 250d may be a dummy gate, and the gate contact 250c may be coupled to an interconnect. In such instance, a contact interconnect (e.g., 260c) may be coupled to the gate contact 250c and the gate contact 250d is not coupled to the contact interconnect 260d.

Figure 10:
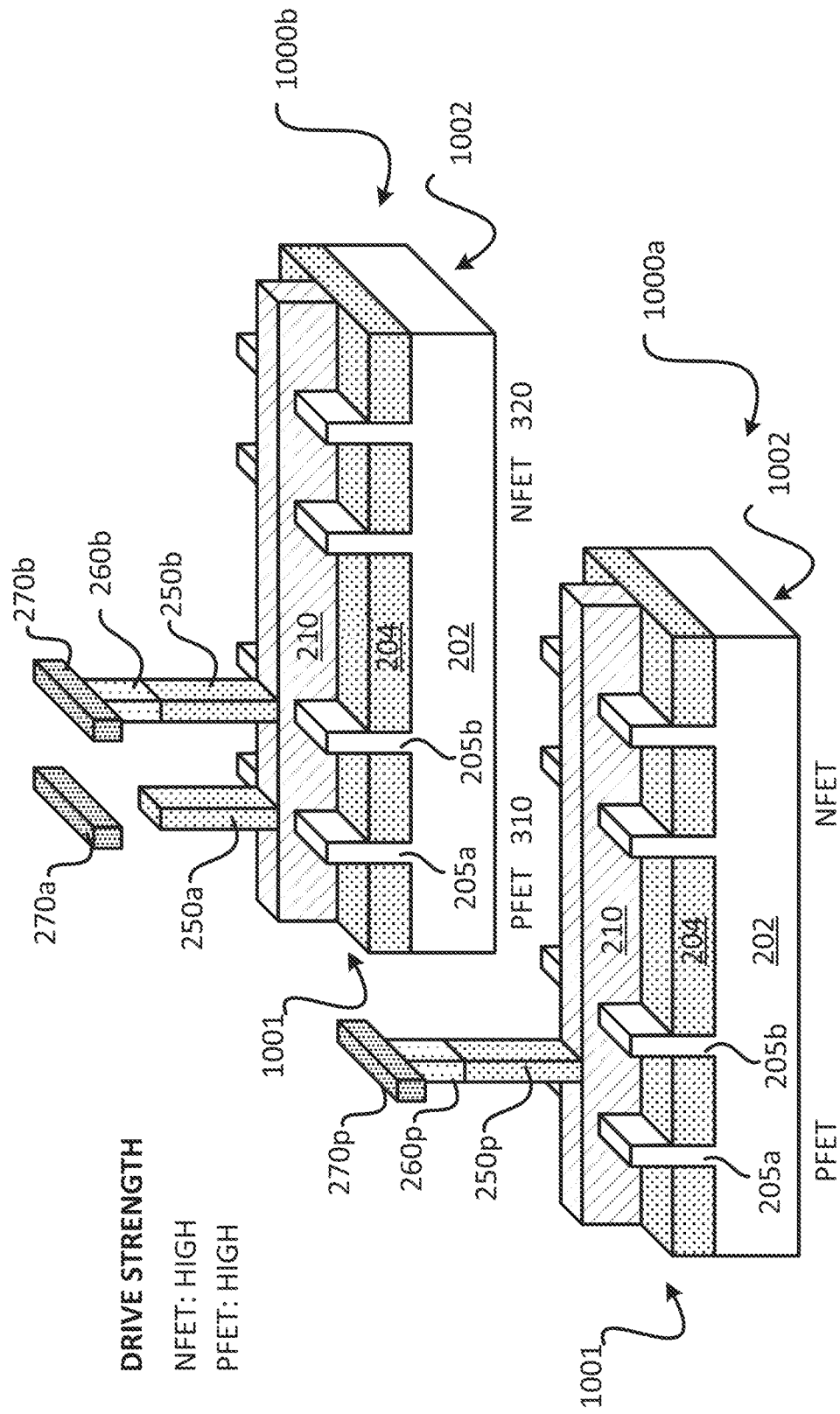
FIG. 10 illustrates an example of finFETs that are coupled to a gate contact and a dummy gate contact.

FIG. 10 illustrates a structure 1000a and a structure 1000b that each includes a first transistor 1001 and a second transistor 1002. The first transistor 1001 is similar to the first transistor 301, and includes similar components as the first transistor 301. The second transistor 1002 is similar to the second transistor 302, and includes similar components as the second transistor 302. FIG. 10 illustrates examples of structures that have high drive strengths (e.g., low threshold voltage (Vt)) for the NFET and the PFET.

FIG. 10 illustrates a gate contact 250p that is coupled to a portion of the gate 210 that is between the fin 205a and the fin 205b of the structure 1000a. The gate contact 250p is located over the PFET active region 310. The contact interconnect 260p is coupled to the gate contact 250p. The interconnect 270p is coupled to contact interconnect 260p.

FIG. 10 illustrates (i) a gate contact 250a that is coupled to a portion of the gate 210 that is above the fin 205a of the structure 1000b, (ii) a gate contact 250b that is coupled to a portion of the gate 210 that is above the fin 205b of the structure 1000b. The gate contact 250a and the gate contact 250b are located in the PFET active region 310. The gate contact 250a is a dummy gate. The contact interconnect 260b is coupled to the gate contact 250b. The interconnect 270b is coupled to contact interconnect 260b. In some implementations, the gate contact 250b may be a dummy gate, and the gate contact 250a may be coupled to an interconnect. In such instance, a contact interconnect (e.g., 260a) may be coupled to the gate contact 250a and the gate contact 250b is not coupled to the contact interconnect 260b.

Figure 11:
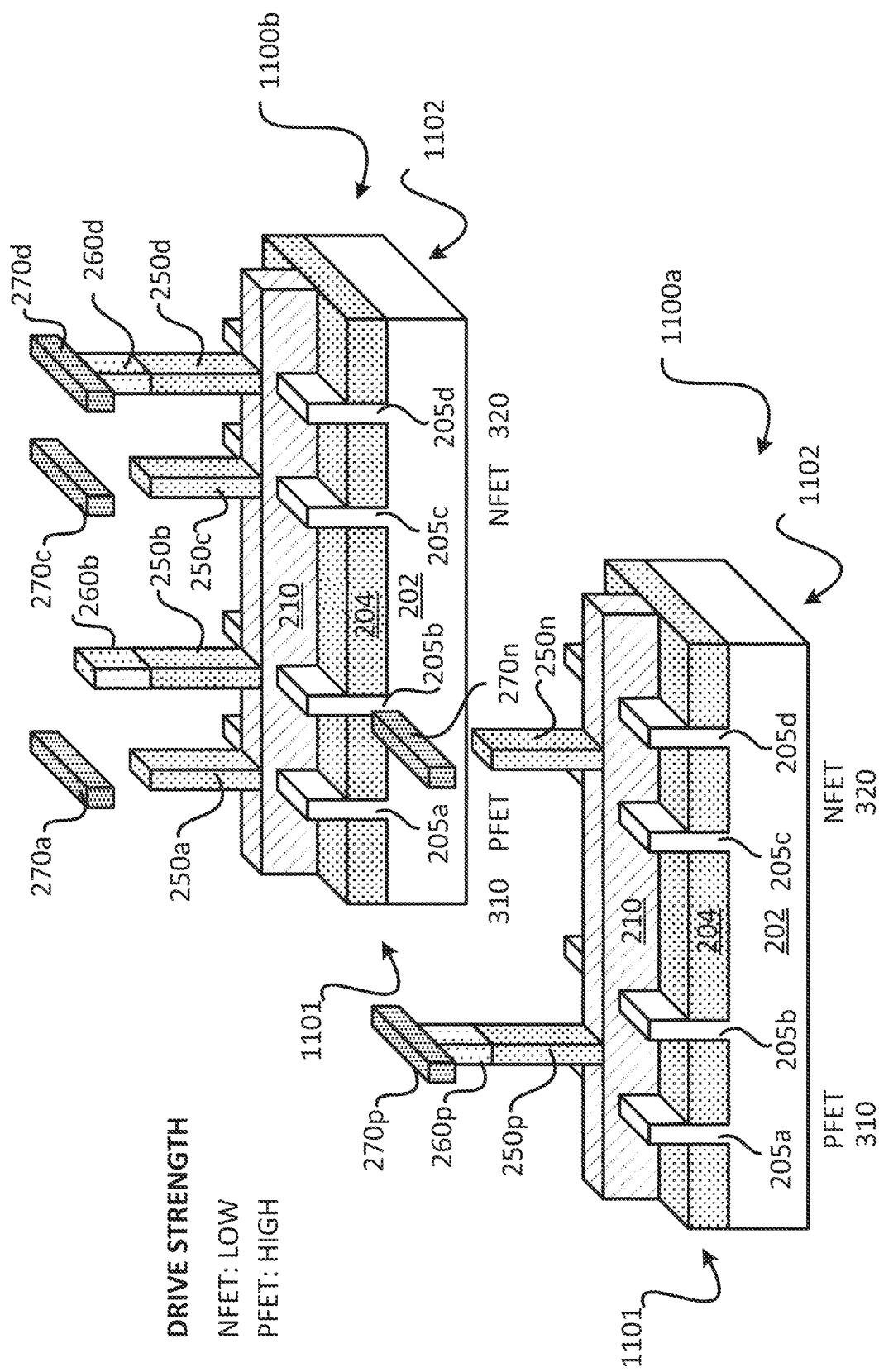
FIG. 11 illustrates an example of finFETs that are coupled to a gate contact and a dummy gate contact.

FIG. 11 illustrates a structure 1100a and a structure 1100b that each includes a first transistor 1101 and a second transistor 1102. The first transistor 1101 is similar to the first transistor 301, and includes similar components as the first transistor 301. The second transistor 1102 is similar to the second transistor 302, and includes similar components as the second transistor 302. FIG. 11 illustrates examples of structures that have a high drive strength (e.g., low threshold voltage (Vt)) for the PFET and a low drive strength (e.g., high threshold voltage (Vt)) for the NFET.

FIG. 11 illustrates a gate contact 250p that is coupled to a portion of the gate 210 that is between the fin 205a and the fin 205b of the structure 1100a. The gate contact 250p is located in the PFET active region 310. The contact interconnect 260p is coupled to the gate contact 250p. The interconnect 270p is coupled to contact interconnect 260p.

FIG. 11 also illustrates a gate contact 250n that is coupled to a portion of the gate 210 that is between the fin 205c and the fin 205d of the structure 1100a. The gate contact 250n is located in the NFET active region 320. The gate contact 250n may be a dummy gate contact.

In some implementations, the configuration shown for the structure 1100a may be different. That is, the structure 1100a may be modified so that the gate contact 250p is a dummy gate and the gate contact 250n is a driving gate contact. In such a modified instance, a contact interconnect (e.g., 260p) may be coupled to the gate contact 250n (instead of the gate contact 250p) and the gate contact 250p is not coupled to the contact interconnect 260p.

FIG. 11 illustrates (i) a gate contact 250a that is coupled to a portion of the gate 210 that is above the fin 205a of the structure 1100b, (ii) a gate contact 250b that is coupled to a portion of the gate 210 that is above the fin 205b of the structure 1100b, (iii) a gate contact 250c that is coupled to a portion of the gate 210 that is above the fin 205c of the structure 1100b, and (iv) a gate contact 250d that is coupled to a portion of the gate 210 that is above the fin 205d of the structure 1100b. The gate contact 250a and the gate contact 250b are located in the PFET active region 310. The gate contact 250c and the gate contact 250d are located in the NFET active region 320. The gate contact 250a, the gate contact 250b, and the gate contact 250c are dummy gate contacts. The contact interconnect 260b is coupled to the gate contact 250b. The contact interconnect 260b may be a dummy contact interconnect, since the contact interconnect 260b is not directly coupled to an interconnect. The contact interconnect 260d is coupled to the gate contact 250d. The interconnect 270d is coupled to contact interconnect 260d. The gate contact 250d is the driving gate contact, where a voltage travels through to the gate 210. However, any of the gate contact may be the driving gate contact.

Figure 12:
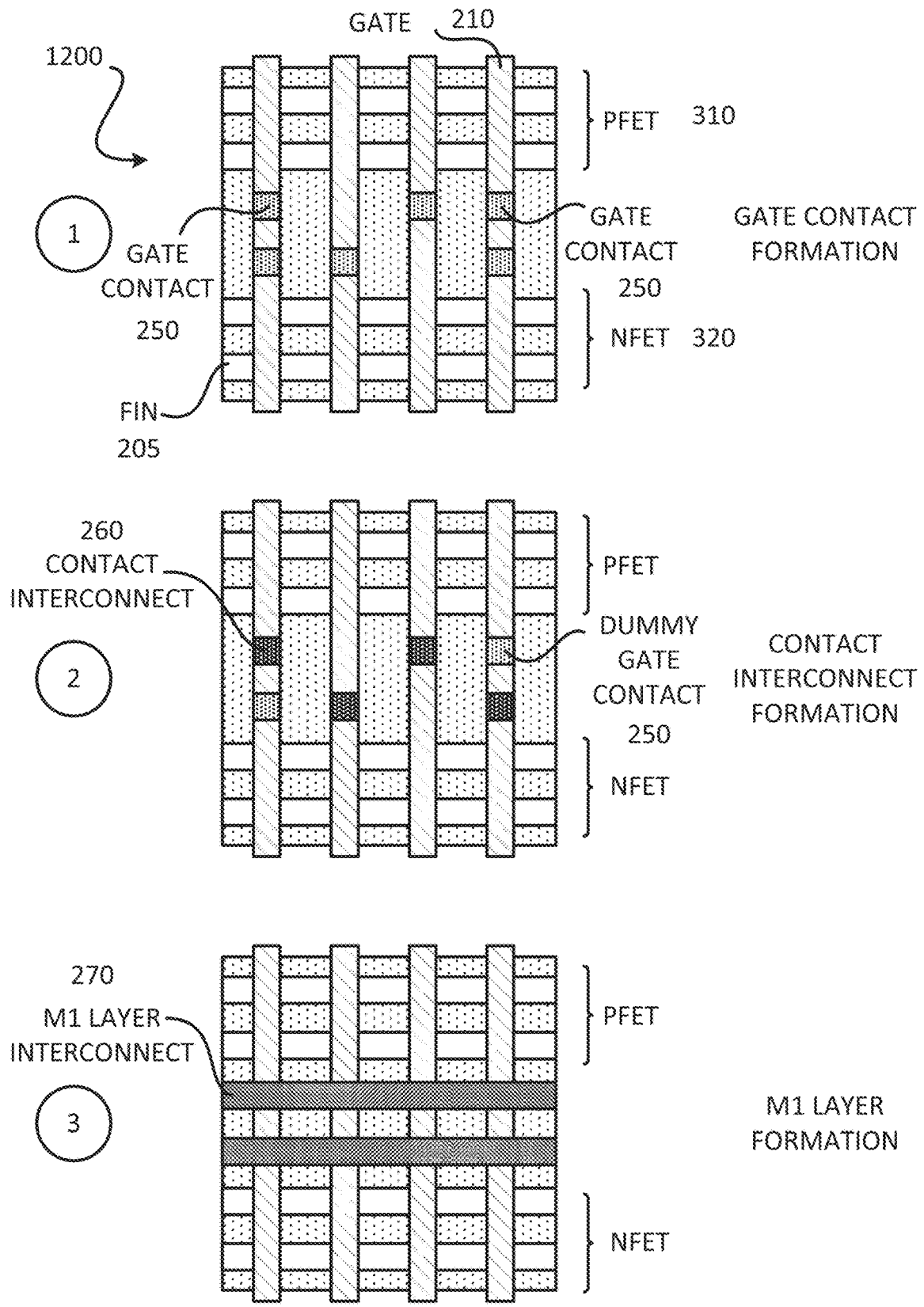
FIG. 12 illustrates a sequence for coupling a gate contact and a dummy gate contact to transistors.

Exemplary Sequence for Fabricating a Structure Comprising a Transistor Coupled to a Dummy Gate Contact In some implementations, fabricating a structure coupled to a dummy gate includes several processes. FIG. 12 illustrates an exemplary sequence for providing or fabricating a structure that is coupled to a dummy gate. In some implementations, the sequence of FIG. 12 may be used to provide or fabricate the structures of FIGS. 3 and 5-11 described in the present disclosure. In addition, the sequence for fabricating the structure may be used to fabricate several structures at the same time.

It should be noted that the sequence of FIG. 12 may combine one or more stages in order to simplify and/or clarify the sequence for providing or fabricating a structure coupled to a dummy gate. In some implementations, the order of the processes may be changed or modified. In some implementations, one or more of processes may be replaced or substituted without departing from the spirit of the disclosure.

Stage 1, as shown in FIG. 12, illustrates a state after a structure 1200 is provided. The structure 1200 includes a substrate, a plurality of fins 205, a plurality of gates 210, a PFET active region 310, a NFET active region 320, and a plurality of gate contact 250. A front end of line (FEOL) process may be used to provide (e.g., fabricate) the plurality of fins 205, the plurality of gates 210, the PFET active region 310, the NFET active region 320, and the plurality of gate contact 250.

Stage 2 illustrates a state after contact interconnects 260 are formed over some of the gate contacts 250. When a contact interconnect 260 is not formed over the gate contact, then those gate contact may be considered as dummy gate contact. A plating process may be used to form the contact interconnects.

Stage 3 illustrates a state after interconnects 270 are formed over contact interconnects 260. The interconnects 270 may be M1 layer interconnects of an integrated device. A plating process may be used to form the contact interconnects.

Having described a high-level description of how structures and dummy gate contacts are fabricated, a more detailed sequence of fabricating structures and dummy gate contacts will now be described below.

Exemplary Sequence for Fabricating a Structure Comprising a Transistor Coupled to a Dummy Gate Contact In some implementations, fabricating a structure coupled to a dummy gate contact includes several processes. FIG. 13 (which includes FIGS. 13A-13D) illustrates an exemplary sequence for providing or fabricating a structure coupled to a dummy gate contact. In some implementations, the sequence of FIGS. 13A-13D may be used to provide or fabricate the structure coupled to a dummy gate contact of FIGS. 3 and 5-11. In addition, the sequence for fabricating the structure coupled to a dummy gate contact may be used to fabricate several structures at the same time. However, for the purpose of clarity, the sequence of FIG. 13 illustrates the fabrication of one structure.

It should be noted that the sequence of FIGS. 13A-13D may combine one or more stages in order to simplify and/or clarify the sequence for providing or fabricating a structure coupled to a dummy gate. In some implementations, the order of the processes may be changed or modified. In some implementations, one or more of processes may be replaced or substituted without departing from the spirit of the disclosure.

Figure 13A:
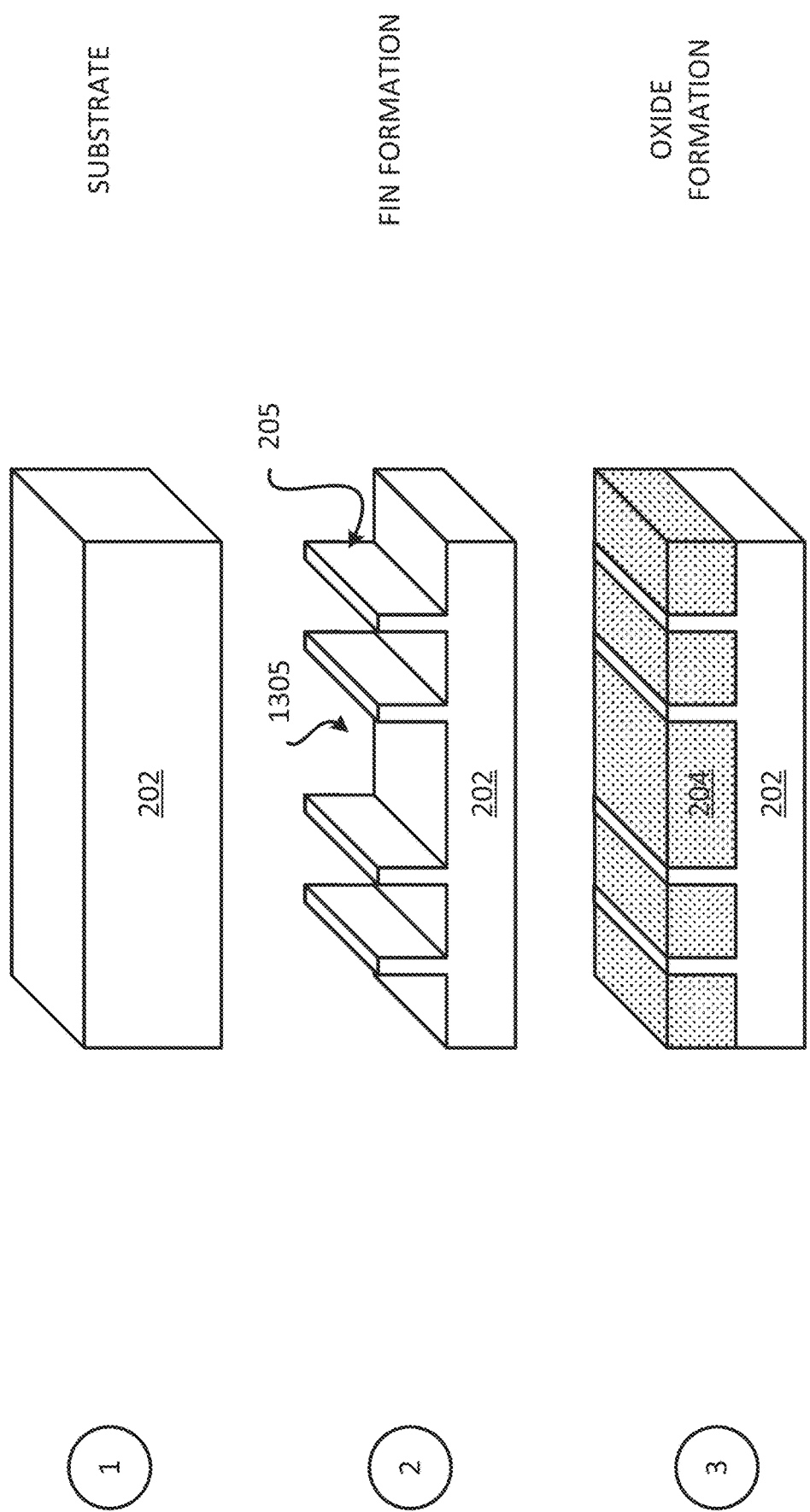
FIG. 13 (comprising FIGS. 13A-13D) illustrates an exemplary sequence for fabricating a finFET coupled to a dummy gate contact.

Stage 1, as shown in FIG. 13A, illustrates a state after a substrate 202 is provided. Different implementations may provide different materials for the substrate 202. In some implementations, the substrate 202 may include silicon (Si). In some implementations, the substrate 202 may already include dopant. In some implementations, the substrate 202 may be doped with a P type dopant or a N type dopant. The substrate 202 may include wells (e.g., N well, P well).

Stage 2 illustrates a state after fins 205 are formed over the substrate 202. The process of forming fins 205 includes forming trenches 1305 in the substrate 202. A hard mark and a resist (e.g., patterned resist) may be positioned over the substrate 202. The fins 205 may be etched through an etching process (e.g., anisotropic etch process). The fins 205 may include fins (e.g., 205a, 205b, 205c, 205d).

Stage 3 illustrates a state after an oxide 204 is formed over the substrate 202 and the trench 1305, such that the oxide 204 is between the fins 205. An oxide deposition process may be used to form the oxide 204. A planarization process, such as a chemical mechanical polishing (CMP) process may be used to planarize the oxide 204.

Figure 13B:
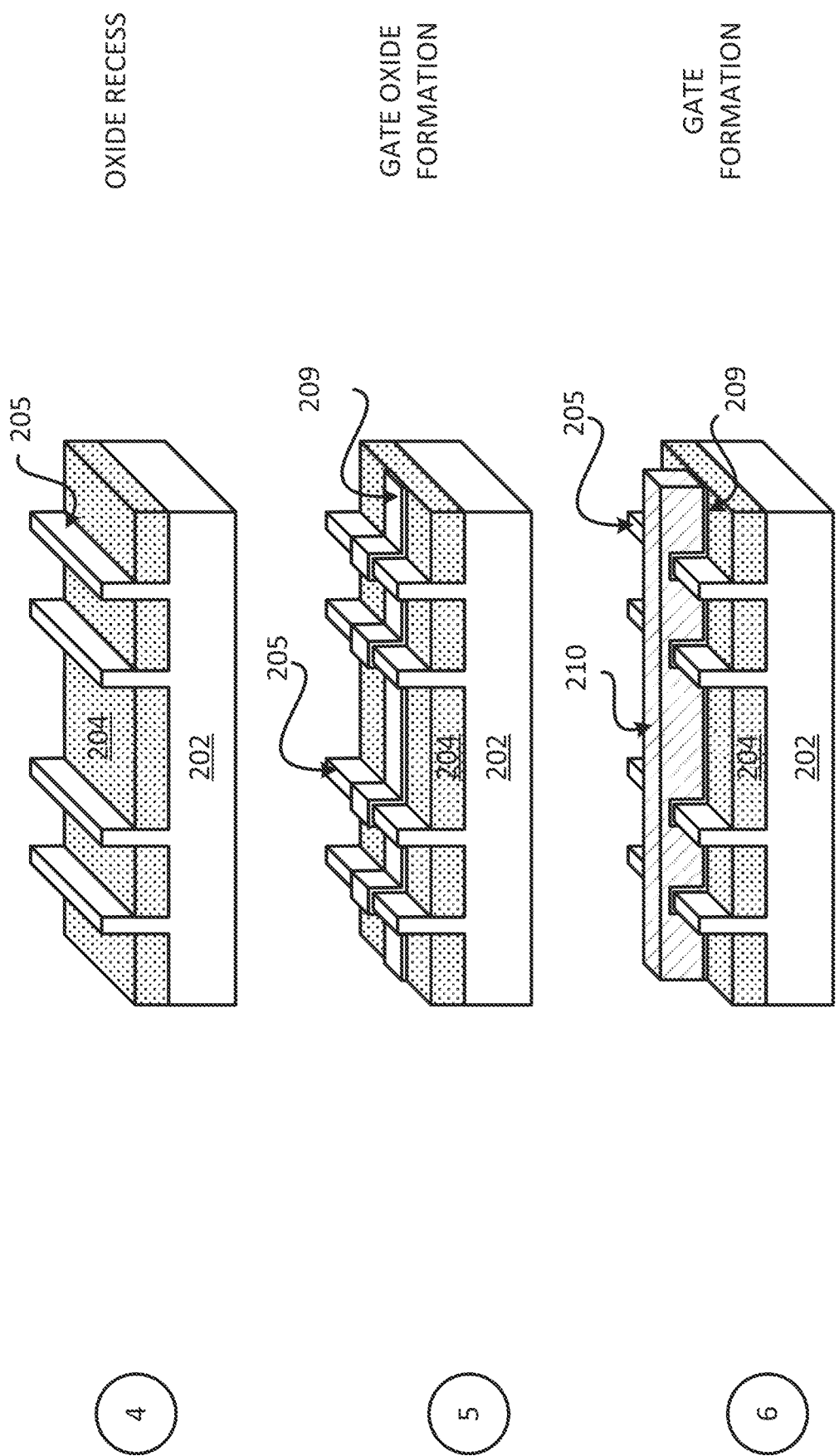

Stage 4, as shown in FIG. 13B, illustrates a state after oxide recess, where portions of the oxide 204 are further removed. Another etching process may be used to remove portions of the oxide 204, leaving side portions of the fins 205 exposed.

Stage 5 illustrates a state after a gate oxide 209 is formed over portions of the oxide 204 and portions of the fins 205. A deposition process may be used to form the gate oxide 209.

Stage 6 illustrates a state after the gate 210 is formed over the fins 205 and the oxide 204. The gate 210 may be formed over the gate oxide 209. The gate 210 may include a poly silicon layer that is doped with a dopant (e.g., N+ dopant). As shown at Stage 6, the gate 210 surround the three sides of the fins 205.

Figure 13C:
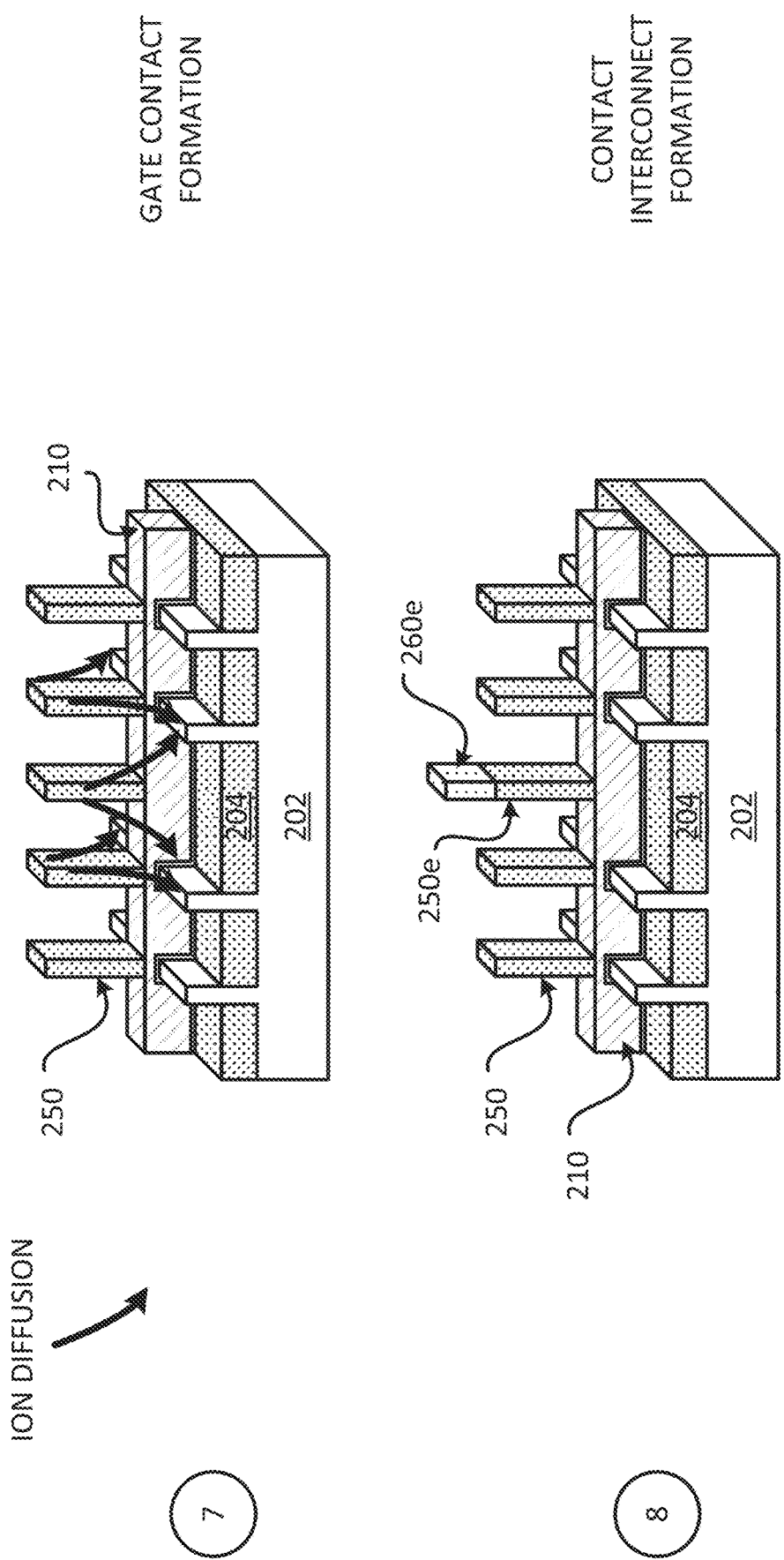

Stage 7, as shown in FIG. 13C, illustrates a state after one or more gate contacts 250 (e.g., 250a, 250b, 250c, 250d, 250e) is formed over the various portions of the gate 210. In this example, the gate contact 250a is located over the fin 205a, the gate contact 250b is located over the fin 205b, the gate contact 250c is located over the fin 205c, and the gate contact 250d is located over the fin 205d. The gate contact 250e is located between the gate contact 250b and the gate contact 250c. A plating and etching process may be used to form the gate contacts 250. As will be further described below, at least one of the gate contact may be a dummy gate contact. As mentioned above, the process of forming the gate contacts 250 may result in ions (e.g., oxygen ions) to be diffused into the fins 205. How much ions that are diffused in a respective fin from a respective gate contact (e.g., dummy gate contact) may depend on the size and location of each particular gate contact (e.g., dummy gate contact). The number and/or amount of ions in the fins 205 may affect the work metal function of the transistor, which affects the drive strength of gate contact and the threshold voltage for the transistor. Stage 7 conceptually illustrates examples of how ions from the gate contacts (e.g., dummy gate contact) may diffuse into the fins.

Stage 8 illustrates a state after at least one contact interconnect 260 is formed over the gate contact 250. The contact interconnect 260 may be formed using a plating process. The contact interconnect 260e is coupled to the gate contact 250e.

Figure 13D:
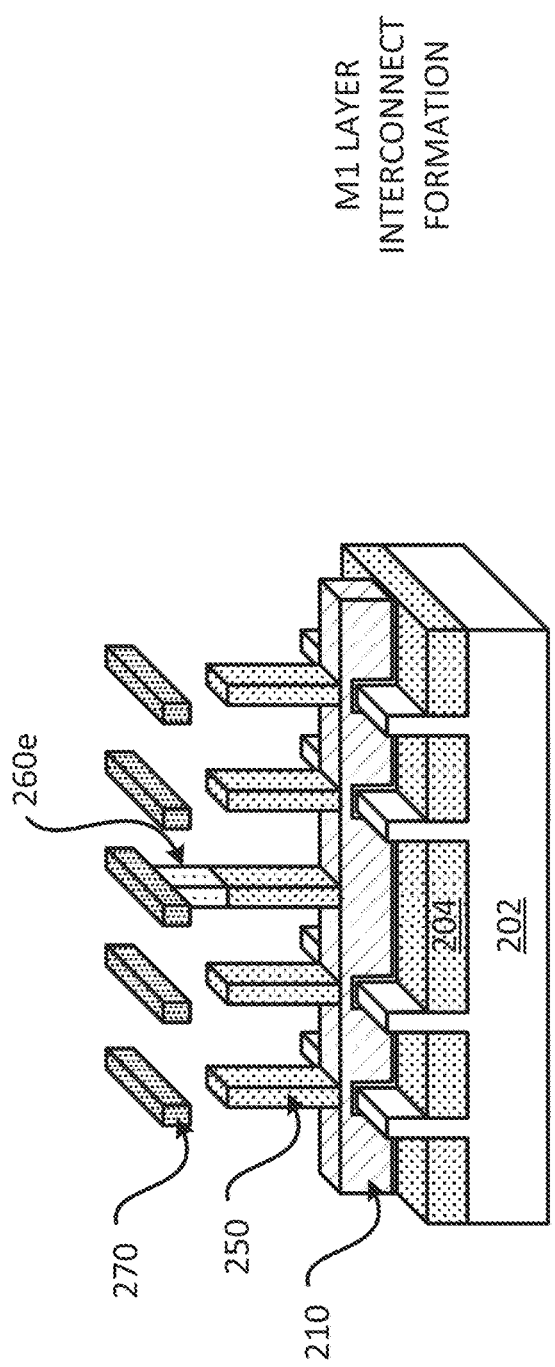

Stage 9, as shown in FIG. 13D, illustrates a state after interconnects 270 are formed. A plating process may be used to form the interconnects 270. The interconnects 270 may be M1 layer interconnects of an integrated device. The interconnects 270 may be formed such that the interconnect 270e is coupled to the contact interconnect 260e. Stage 9 may illustrate an example of the structure 300 that is coupled to at least one dummy gate contact. The dummy gate contact may be considered part of the structure 300.

Although not shown for the purpose of clarity, one or more dielectric layers may be formed over and/or around the fins 205, the gate 210, the gate contact 250, the contact interconnect 260 and/or the interconnect 270.

Figure 14:
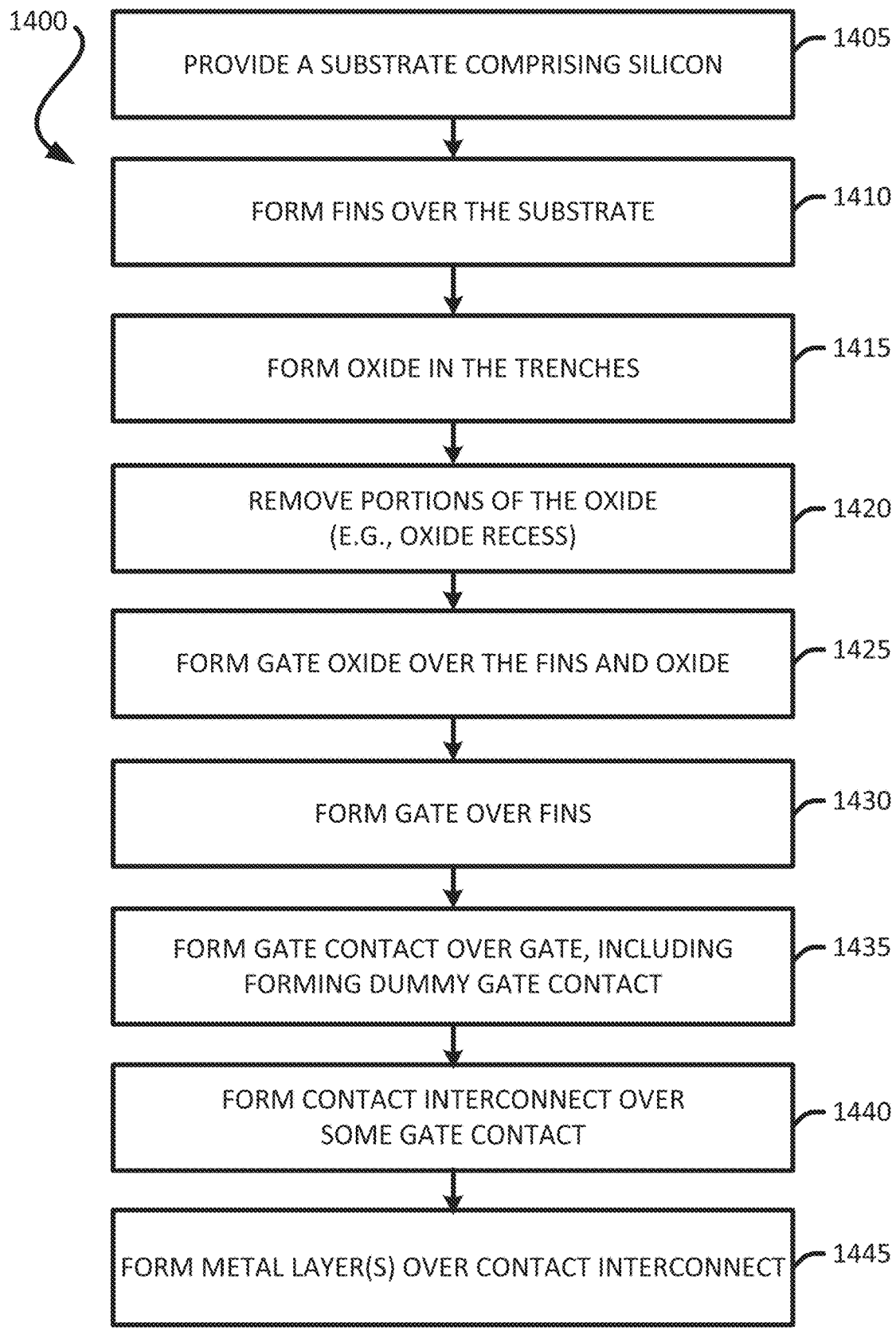
FIG. 14 illustrates an exemplary flow diagram of a method for fabricating a finFET coupled to a dummy gate contact.

Exemplary Flow Diagram of a Method for Fabricating a Structure Comprising a Transistor Coupled to a Dummy Gate Contact In some implementations, fabricating a structure coupled to a dummy gate contact includes several processes. FIG. 14 illustrates an exemplary flow diagram of a method 1400 for providing or fabricating a structure coupled to a dummy gate contact. In some implementations, the method 1400 of FIG. 14 may be used to provide or fabricate the structure coupled to a dummy gate contact of FIGS. 3 and 5-11 described in the present disclosure.

It should be noted that the method of FIG. 14 may combine one or more processes in order to simplify and/or clarify the method for providing or fabricating a structure coupled to a dummy gate contact. In some implementations, the order of the processes may be changed or modified.

The method provides (at 1405) a substrate 202. The substrate 202 may include silicon. The substrate 202 may be doped with a P type dopant or a N type dopant. The substrate 202 may include wells (e.g., N well, P well). Stage 1 of FIG. 13A may illustrate an example of providing a substrate 202.

The method forms (at 1410) fins 205 in the substrate. The fins may be formed by using a masking, resist and etching process. The fins 205 may be formed by forming trenches 1305 in the substrate 202. Separate portions of the fins may form the basis for a source and a drain for a transistor. Stage 2 of FIG. 13A may illustrate an example of forming fins in a substrate.

The method forms (at 1415) an oxide 204 over the substrate 202 and in the trench 1305, such that the oxide 204 is between the fins 205. An oxide deposition process may be used to form the oxide 204. A planarization process, such as a chemical mechanical polishing (CMP) process may be used to planarize the oxide 204. Stage 3 of FIG. 13A may illustrate an example of forming an oxide.

The method removes (at 1420) portions of the oxide 204. An oxide recess process may be used to remove portions of the oxide 204. An etching process may be used to remove portions of the oxide 204, such that side portions of the fins 205 are exposed. Stage 4 of FIG. 13B may illustrate a state after oxide recess.

The method forms (at 1425) a gate oxide 209 over portions of the oxide 204 and the fins 205. A deposition process may be used to form the gate oxide 209. Stage 5 of FIG. 13B may illustrate an example of forming a gate oxide.

The method forms (at 1430) a gate 210 over the fins 205 and the oxide 204. The gate 210 may be formed over the gate oxide 209. The gate 210 may include a poly silicon layer that is doped with a dopant (e.g., N+ dopant). A deposition process may be used form the gate 210. Stage 6 of FIG. 13B may illustrate an example of a gate formed over fins.

The method forms (at 1435) gate contacts 250 over the gate 210. At least one of the gate contact may be a dummy gate contact, and at least one of the gate contact may be a driving gate contact configured to provide a voltage to the gate 210. A plating process may be used to form the gate contacts 250. Stage 7 of FIG. 13C may illustrate an example of providing a dummy gate contact.

The method forms (at 1440) at least one contact interconnect 260 over at least one gate contact 250. The contact interconnect 260 may be formed using a plating process. In some implementations, a gate contact that is defined as a dummy gate contact may not have a contact interconnect coupled to it. Stage 8 of FIG. 13C may illustrate an example of forming contact interconnects. In some implementations, at least one of the contact interconnects may be a dummy contact interconnect.

The method forms (at 1445) interconnects 270 over the structure. In particular interconnects 270 may be formed over at least one gate contact 250 and/or over at least one contact interconnect 260. A plating process may be used to form the interconnects 270. The interconnects 270 may be M1 layer interconnects of an integrated device. Stage 9 of FIG. 13D may illustrate a state after interconnects 270 are formed.

Exemplary Integrated Device Comprising a Transistor and a Dummy Gate Contact

Figure 15:
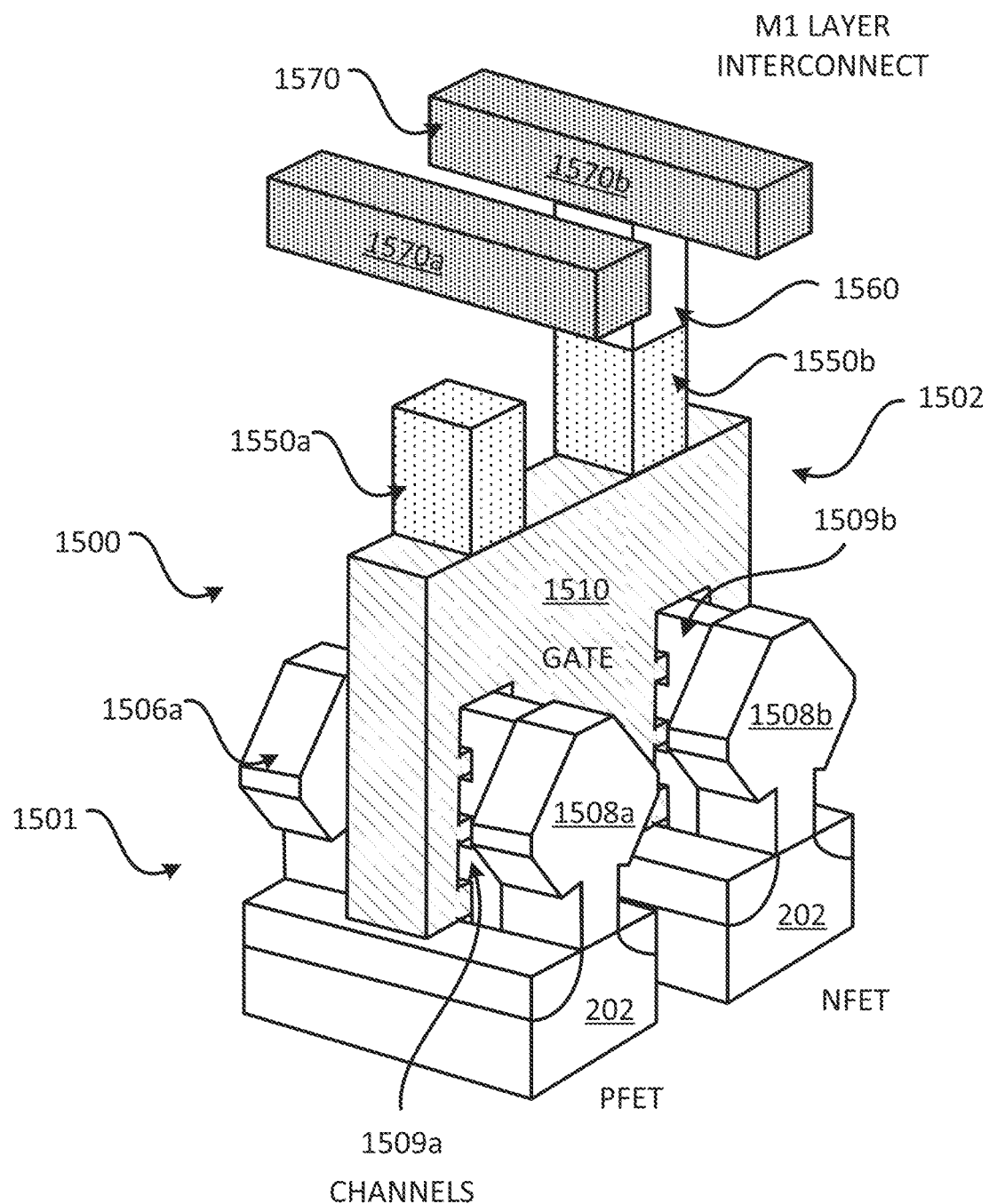
FIG. 15 illustrates a gate all around (GAA) FET that is coupled to a dummy gate contact.

The use of dummy gate contacts is not limited to finFETs. The dummy gate contacts as described in the disclosure may be applicable to other transistors, such as the planar FET transistor 200 and a gate all around (GAA) FET. FIG. 15 illustrates an example of a structure 1500 that includes a first GAA FET 1501 and a second GAA FET 1502. The first GAA FET 1501 includes a substrate 202, a source 1506*a*, a drain 1508*a*, a plurality of channels 1509*a* and a gate 1510. The second GAA FET 1502 includes the substrate 202, a source 1506*b* (not shown), a drain 1508*b*, a plurality of channels 1509*b* and the gate 1510.

A gate contact 1550*a* and a gate contact 1550*b* are coupled to the gate 1510. The gate contact 1550*a* may be a dummy gate contact, and the gate contact 1550*b* may be a driving gate contact. A contact interconnect 1560 is coupled to the gate contact 1550*b*. An interconnect 1570 is coupled to the contact interconnect 1560. The structure 1500, the first GAA FET 1501 and/or the second GAA FET 1502 may be implemented in any of the integrated devices described in the disclosure. Any of the dummy gate contact described in the disclosure may be implemented over the structure 1500, the first GAA FET 1501 and/or the second GAA FET 1502. Processes known to a person of ordinary skill in the art may be used to fabricate a GAA FET.

Exemplary Integrated Device Comprising a Transistor and a Dummy Gate Contact

Figure 16:
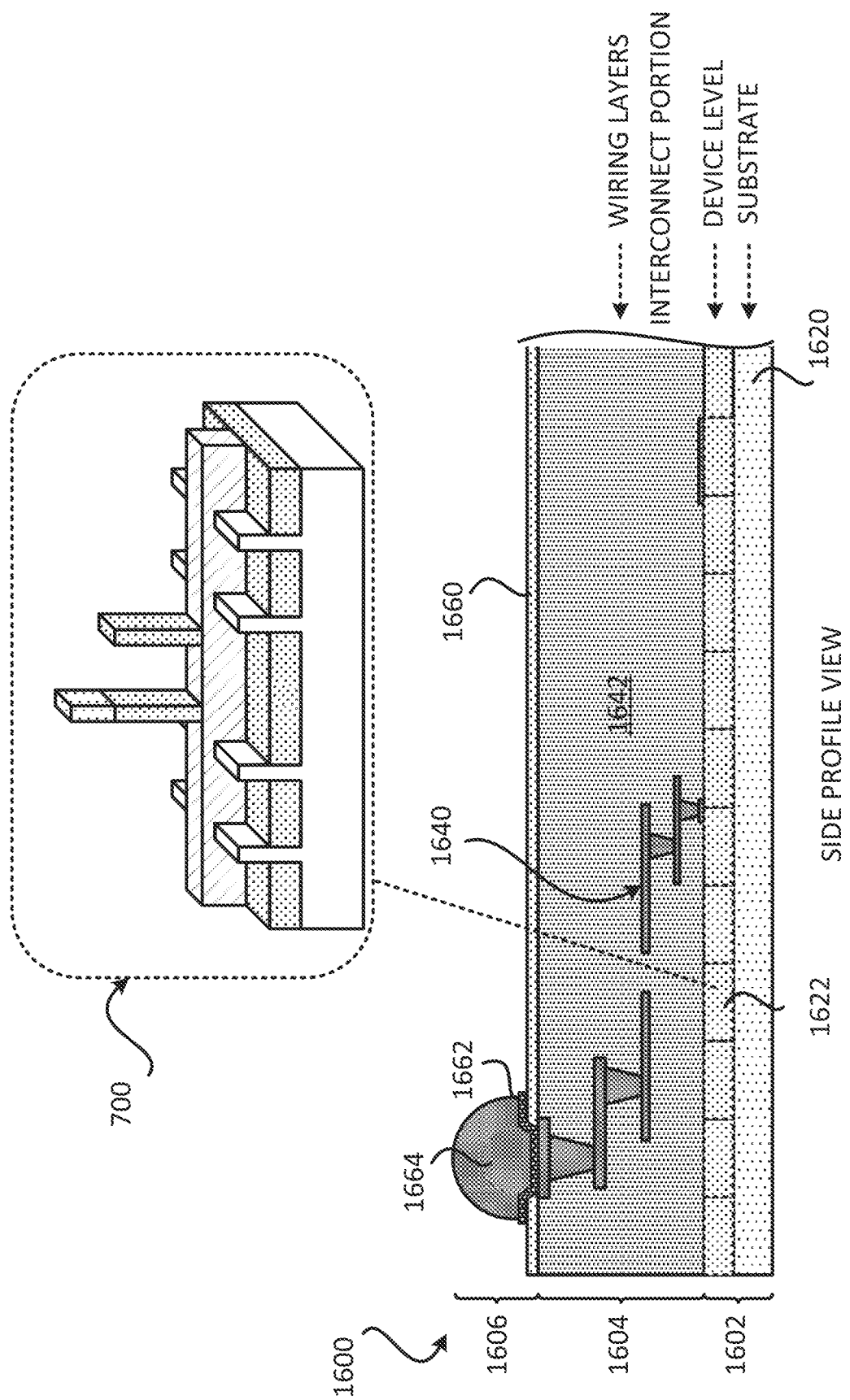
FIG. 16 illustrates a view of an integrated device that includes a transistor coupled to a dummy gate contact.

FIG. 16 illustrates a profile view of an integrated device 1600 that includes a transistor and a dummy gate contact. The integrated device 1600 includes a substrate 1620, a plurality of device level cells 1622 (e.g., logic cells), interconnect portion 1604, and a packaging portion 1606. The plurality of device level cells 1622 is formed over the substrate 1620. The plurality of device level cells 1622 may form the device level layer of the integrated device 1600. In some implementations, the plurality of device level cells 1622 may include portions of the substrate 1620. In some implementations, the substrate 1620, the device level layer and the plurality of device level cells 1622 may be referred as the substrate portion 1602 of the integrated device 1600.

The plurality of device level cells 1622 may include one or more transistors. As shown in FIG. 16, one of the device level cells includes a structure 700 (as shown and described in FIG. 7), which includes a transistor coupled to a dummy gate contact. It is noted that the integrated device 1600 may include other types of devices, structures, and/or transistors, as described in the disclosure. In some implementations, different cells of the integrated device 1600 may use different or the same structure of transistors coupled to various configurations of gate contact, contact interconnects and/or interconnects. The integrated device 1600 may include any configuration of transistors, gate contact, dummy gate contact, contact interconnect, and/or dummy contact interconnect described in the disclosure. The integrated device 1600 may include device level cells 1622 with the same configuration of transistors, gate contact, dummy gate contact, contact interconnect, and/or dummy contact interconnect, different configurations of transistors, gate contact, dummy gate contact, contact interconnect, and/or dummy contact interconnect, and/or combinations thereof. A gate contact (e.g., 250) may be configured to be electrically coupled to an interconnect (e.g., interconnect of M1 metal layer) of an integrated device. For example, a gate contact may be configured to be electrically coupled to a contact interconnect, which is coupled to a M1 layer interconnect.

The interconnect portion 1604 is formed over the substrate portion 1602. In particular, the interconnect portion 1604 is formed over the plurality of device level cells 1622. The interconnect portion 1604 includes wiring layers. The interconnect portion 1604 includes a plurality of interconnects 1640 (e.g., trace, pad, vias) and at least one dielectric layer 1642. The interconnect portion 1604 may provide interconnect between the plurality of transistors. The M1 layer interconnect may be part of the interconnect portion 1604. The interconnect portion 1604 may include other metal layers (e.g. M2 layer interconnect, M3 layer interconnect).

A packaging portion 1606 is formed over the interconnect portion 1604. The packaging portion 1606 includes a passivation layer 1660, an under bump metallization (UBM) layer 1662 and a solder interconnect 1664. It is noted that the size and shape of the integrated device 1600 is exemplary. Moreover, the components of the integrated device 1600 shown may not be to scale.

Exemplary Sequence for Fabricating an Integrated Device Comprising a Transistor and a Dummy Gate Contact In some implementations, fabricating an integrated device that includes a transistor and a dummy gate contact includes several processes. FIG. 17 (which includes FIGS. 17A-17B) illustrates an exemplary sequence for providing or fabricating an integrated device that includes a transistor and a dummy gate contact. In some implementations, the sequence of FIGS. 17A-17B may be used to provide or fabricate the integrated device of FIG. 16 and/or other integrated devices described in the present disclosure.

It should be noted that the sequence of FIGS. 17A-17B may combine one or more stages in order to simplify and/or clarify the sequence for providing or fabricating an integrated device that includes a transistor and a dummy gate contact. In some implementations, the order of the processes may be changed or modified. In some implementations, one or more of processes may be replaced or substituted without departing from the spirit of the disclosure.

Stage 1, as shown in FIG. 17A, illustrates a state after a substrate 1620 is provided. Different implementations may provide different materials for the substrate 1620. In some implementations, the substrate 1620 may include silicon (Si). The substrate 1620 may be doped or undoped. The substrate 1620 may be a semi-insulating substrate. The term "undoped" component as used in the disclosure may mean that the component has no dopant or may include a low doping level of a dopant. The low doping level may be a residual doping level.

Stage 2 illustrates a state after the device level layer is formed over the substrate 1620. The device level layer includes the plurality of device level cells 1622. Thus, Stage 2 illustrates a state after the plurality of device level cells 1622 is formed over the substrate 1620. In some implementations, a front end of line (FEOL) process may be used to fabricate the device level layer (e.g., plurality of device level cells 1622). One or more of cells from the plurality of device level cells may include a transistor and/or a gate contact, as described above. A device level cell may include at least parts of the structures (e.g., 300, 500, 600, 700, 800, 900*a*, 900*b*, 1000*a*, 1000*b*, etc) described in the disclosure. FIGS. 13A-13D illustrate a sequence for fabricating a transistor and a dummy gate contact. In some implementations, interconnects may be formed over the gate, source and/or drain of one or more transistors, and over the gate contacts and/or contact interconnects.

Stage 3 illustrates a state after the interconnect portion 1604 is formed. The interconnect portion 1604 may include plurality of interconnects 1640 (located on different metal layers) and at least one dielectric layer 1642. In some implementations, a back end of line (BEOL) process may be used to fabricate interconnect portion 1604. The interconnect portion 1604 may be configured to electrically couple one or more transistors.

Stage 4, as shown in FIG. 17B, illustrates a state after a passivation layer 1660 and the under bump metallization (UBM) layer 1662 are formed over the interconnect portion 1604.

Stage 5 illustrates a state after a solder interconnect is coupled to the under bump metallization (UBM) layer 1662.

Figure 18:
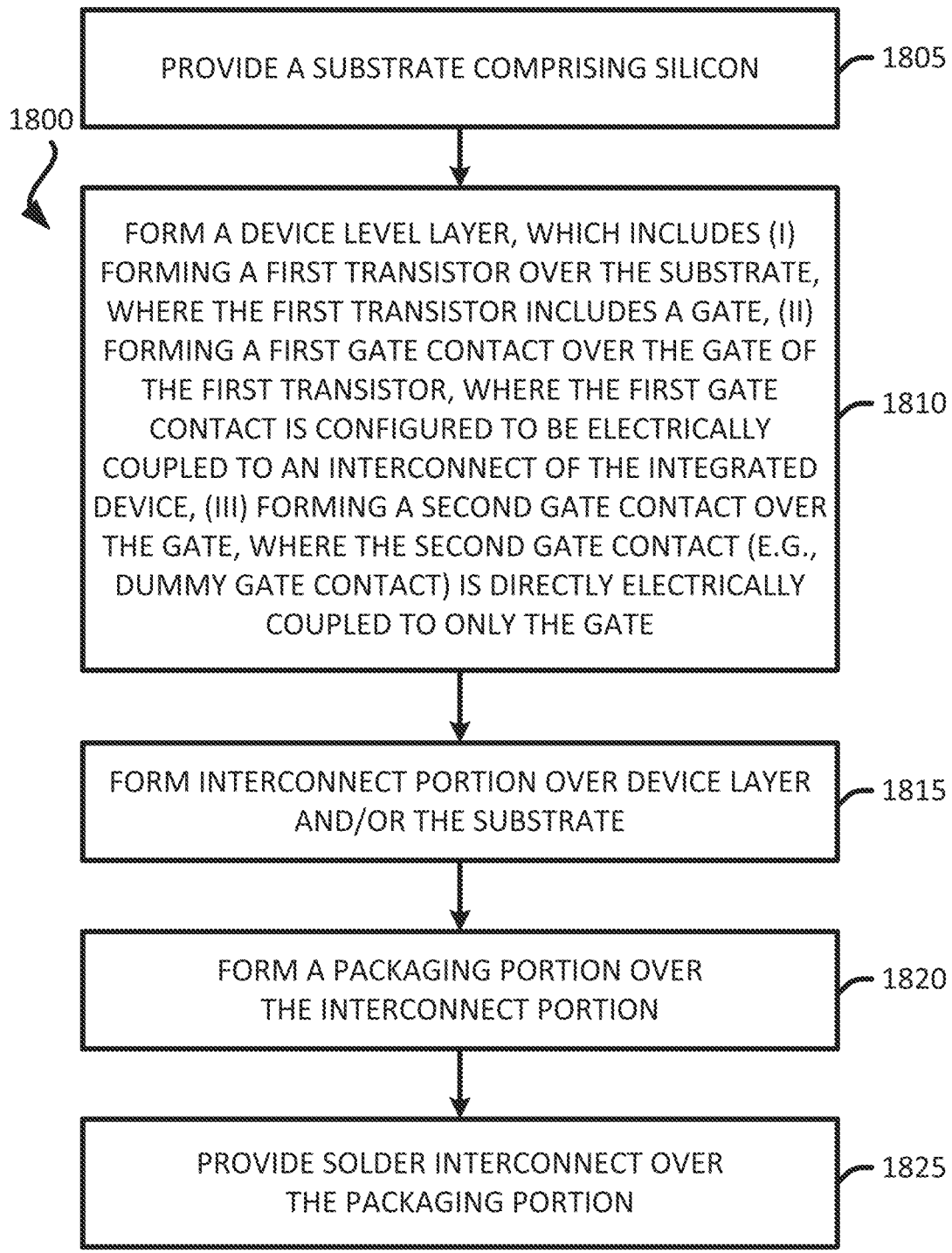
FIG. 18 illustrates an exemplary flow diagram of a method for fabricating an integrated device that includes a transistor coupled to a dummy gate contact.

Exemplary Flow Diagram of a Method for Fabricating an Integrated Device Comprising a Transistor and a Dummy Gate Contact In some implementations, providing an integrated device that includes a transistor and a dummy gate contact includes several processes. FIG. 18 illustrates an exemplary flow diagram of a method 1800 for providing or fabricating an integrated device that includes a transistor and a dummy gate contact. In some implementations, the method 1800 of FIG. 18 may be used to provide or fabricate the integrated device of FIG. 16 and/or other integrated devices described in the present disclosure.

It should be noted that the method of FIG. 18 may combine one or more processes in order to simplify and/or clarify the method for providing or fabricating an integrated device that includes a transistor and a dummy gate contact. In some implementations, the order of the processes may be changed or modified.

The method provides (at 1805) a substrate (e.g., 1620). Different implementations may provide different materials for the substrate. In some implementations, the substrate may include silicon (Si). The substrate may be doped with an N type dopant or a P type dopant. The substrate may be a semi-insulating substrate. Stage 1 of FIG. 17A illustrates an example of providing a substrate.

The method forms (at 1810) a device level layer (e.g., the plurality of device level cells 1622) over the substrate. In some implementations, a front end of line (FEOL) process may be used to fabricate the device level layer (e.g., plurality of device level cells 1622). The device level layer may include a plurality of device level cells. The device level cells may include one or more active devices. One or more device level cells may include a transistor (e.g., 1102), as described in the disclosure. Forming the device level layer may include forming one or more transistors and one or more dummy gate contacts. In some implementations, forming a device level layer includes forming a transistor over the substrate. In some implementations, forming a transistor (e.g., first transistor) over the substrate, includes forming a transistor that includes a source, a drain and a gate. The method may form a first gate contact over the gate of the transistor, wherein the first gate contact is configured to be electrically coupled to an interconnect (e.g., interconnect of M1 layer) of the integrated device. The method may form a second gate contact over the gate, wherein the second gate contact is directly electrically coupled to only the gate. Examples of forming a transistor and a dummy gate contact over a substrate are shown and described in FIGS. 13A-13D and Stage 2 of FIG. 17A.

The method forms (at 1815) an interconnect portion 1604 over the device level layer (e.g., plurality of device level cells 1622) and/or the substrate 1620. The interconnect portion 1604 may include a plurality of interconnect 1640 and at least one dielectric layer 1642. In some implementations, a back end of line (BEOL) process may be used to form the interconnect portion 1604. The interconnect portion 1604 may include the M1 layer. The interconnect portion 1604 may be configured to electrically couple one or more transistors. Stage 3 of FIG. 20A illustrates an example of forming an interconnect portion 1604.

The method forms (at 1820) a packaging portion 1606 over the interconnect portion 1604. The packaging portion 1606 may include the passivation layer 1660 and the under bump metallization (UBM) layer 1662. The passivation layer 1660 and the under bump metallization (UBM) layer 1662 are formed over the interconnect portion 1604. Stage 4 of FIG. 20B illustrates an example of forming a packaging portion 1606.

The method provides (at 1825) a solder interconnect 1664. In some implementations, the solder interconnect 1664 is coupled to the under bump metallization (UBM) layer 1662. Stage 5 of FIG. 20B illustrates an example of coupling a solder interconnect to the packaging portion 1604.

It is also noted that the method 1800 of FIG. 18 may be used to fabricate (e.g., concurrently fabricate) several integrated devices on a wafer. The wafer is then singulated (e.g., cut) into individual integrated devices. These singulated integrated devices may then be coupled to other integrated devices and/or printed circuit boards (PCBs).

Exemplary Electronic Devices

Figure 19:
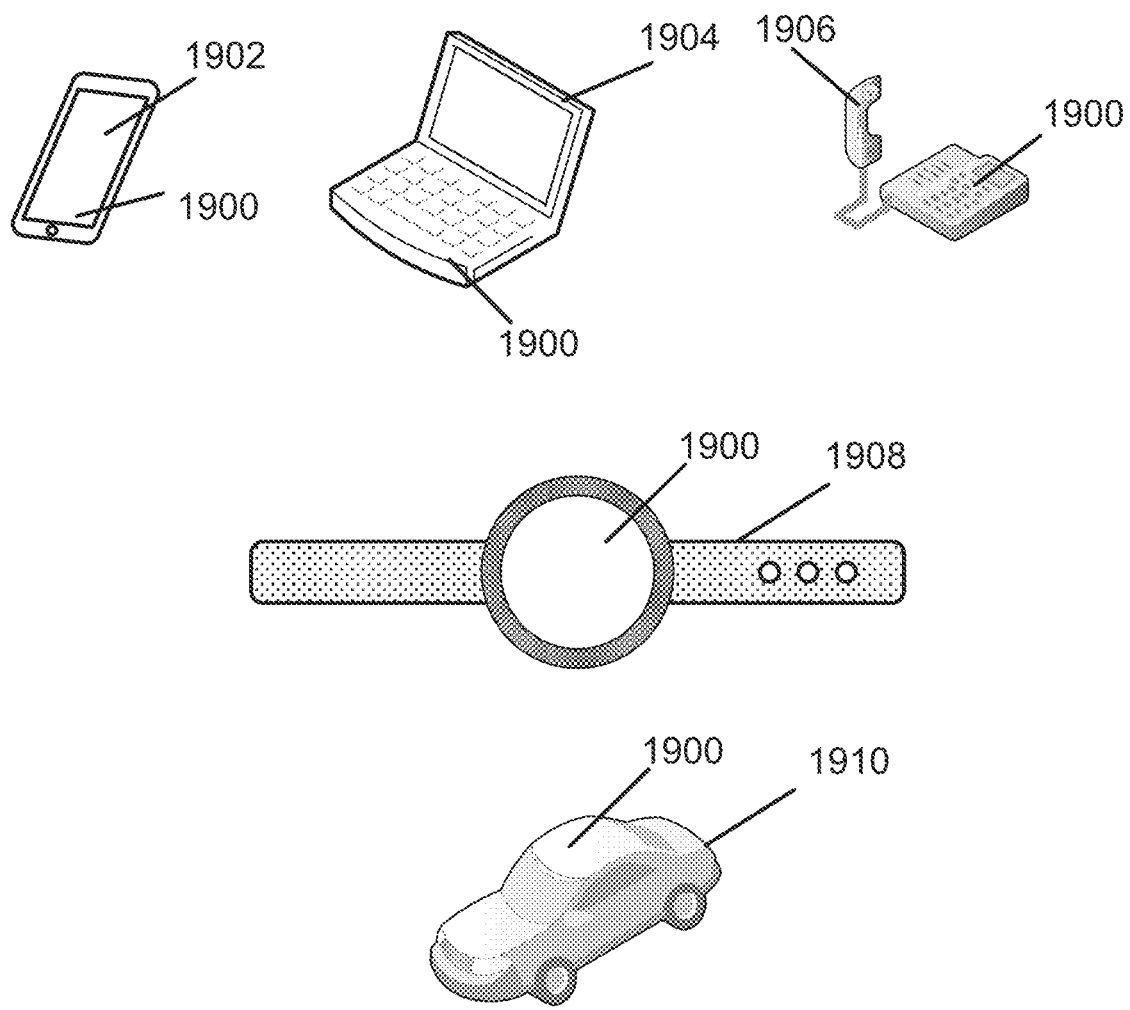
FIG. 19 illustrates various electronic devices that may integrate a die, an integrated device, an integrated passive device (IPD), a device package, a package, an integrated circuit and/or PCB, as described herein.

FIG. 19 illustrates various electronic devices that may be integrated with any of the aforementioned transistor, device, integrated device, integrated circuit (IC) package, integrated circuit (IC) device, semiconductor device, integrated circuit, die, interposer, package or package-on-package (PoP). For example, a mobile phone device 1902, a laptop computer device 1904, a fixed location terminal device 1906, or a wearable device 1908 may include a device 1900 as described herein. The device 1900 may be, for example, any of the devices and/or integrated circuit (IC) packages described herein. The devices 1902, 1904, 1906 and 1908 illustrated in FIG. 19 are merely exemplary. Other electronic devices may also feature the device 1900 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-12, 13A-13D, 14-16, 17A-17B and/or 18-19 may be rearranged and/or combined into a single component, process, feature or function or embodied in several components, processes, or functions. Additional elements, components, processes, and/or functions may also be added without departing from the disclosure. It should also be noted FIGS. 2-12, 13A-13D, 14-16, 17A-17B and/or 18-19 and its corresponding description in the present disclosure is not limited to dies and/or ICs. In some implementations, FIGS. 2-12, 13A-13D, 14-16, 17A-17B and/or 18-19 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The term "encapsulating" means that an object may partially encapsulate or completely encapsulate another object. The use of the terms "first", "second", "third" and "fourth" (and/or anything above fourth) is arbitrary. Any of the components described may be the first, second, third or fourth. For example, a component that is referred to a second component, may be the first component, the second component, the third component or the fourth component. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

In the following, further embodiments are described in order to facilitate understanding of the invention.

An integrated device that includes a substrate, a first transistor located over the substrate, where the first transistor includes a gate. The integrated device includes a first gate contact coupled to the gate of the first transistor, where the first gate contact is configured to be electrically coupled to an interconnect of the integrated device. The integrated device includes a second gate contact coupled to the gate, where the second gate contact is directly electrically coupled to only the gate. The integrated device further includes a second transistor located over the substrate, wherein the second transistor comprises the gate. The second gate contact is configured to tune a threshold voltage required to induce a first current flow in the first transistor and a second current flow in the second transistor. The first transistor includes a first fin and a second fin. The first gate contact may be located over a region that includes the first fin and the second fin. The second gate contact may be located over the region that includes the first fin and the second fin. The second gate contact may be a dummy gate contact.

An apparatus that includes a substrate, a first transistor located over the substrate, where the first transistor comprises a gate. The apparatus includes a first gate contact coupled to the gate of the first transistor, where the first gate contact is configured to be electrically coupled to an interconnect of the integrated device. The apparatus includes means for tuning a voltage required to induce a first current flow in the first transistor, where the means for tuning is directly electrically coupled to only the gate.

An integrated device that includes a substrate, a first transistor located over the substrate, where the first transistor comprises a gate. The integrated device includes a first gate contact coupled to the gate of the first transistor, where the first gate contact is configured to be electrically coupled to an interconnect of the integrated device. The integrated device includes a second gate contact coupled to the gate, and a contact interconnect coupled to the second gate contact, where the contact interconnect is directly electrically coupled to only the gate contact.

A method for fabricating an integrated device. The method provides a substrate. The method forms a first transistor over the substrate, wherein the first transistor comprises a gate. The method forms a first gate contact over the gate of the first transistor, wherein the first gate contact is configured to be electrically coupled to an interconnect of the integrated device. The method forms a second gate contact over the gate, wherein the second gate contact is directly electrically coupled to only the gate.

What is claimed is:

1. An integrated device comprising:
   a substrate comprising a first active region, a second active region, and a field region located between the first active region and the second active region;
   a first transistor located over the substrate, wherein the first transistor comprises the first active region and a gate;
   a second transistor located over the substrate, wherein the second transistor comprises the second active region and the gate;
   a first gate contact coupled to the gate of the first transistor and the second transistor, wherein the first gate contact is configured to be electrically coupled to an interconnect of the integrated device; and
   a second gate contact coupled to the gate,
      wherein the second gate contact is located entirely over the field region of the substrate,
      wherein the second gate contact is directly electrically coupled to only the gate, and
      wherein the first gate contact is located over the field region of the substrate.

2. The integrated device of claim 1, further comprising a contact interconnect coupled to the first gate contact.

3. The integrated device of claim 1, wherein the second gate contact is configured to tune a threshold voltage required to induce a first current flow in the first transistor and a second current flow in the second transistor.

4. The integrated device of claim 1, wherein the first transistor includes a p-channel field effect transistor (PFET) and the second transistor includes a n-channel field effect transistor (NFET).

5. The integrated device of claim 1, wherein the first transistor includes a n-channel field effect transistor (NFET) and the second transistor includes a p-channel field effect transistor (PFET).

6. The integrated device of claim 1, wherein the first transistor includes a first fin and a second fin.

7. The integrated device of claim 6, wherein the first gate contact is located over a region that includes the first fin and the second fin.

8. The integrated device of claim 6, wherein the second transistor includes a third fin and a fourth fin.

9. The integrated device of claim 6, wherein the first transistor includes a p-channel field effect transistor (PFET).

10. The integrated device of claim 6, wherein the first transistor includes a n-channel field effect transistor (NFET).

11. The integrated device of claim 1, further comprising a third gate contact coupled to the gate, wherein the third gate contact is directly electrically coupled to only the gate, wherein the second gate contact is a dummy gate contact.

12. The integrated device of claim 1,
   wherein the first transistor is a p-channel field effect transistor (PFET),
   wherein the second transistor is a n-channel field effect transistor (NFET), and
   wherein the first gate contact is located over the first transistor.

13. The integrated device of claim 1,
   wherein the first transistor is a p-channel field effect transistor (PFET),
   wherein the second transistor is a n-channel field effect transistor (NFET), and
   wherein the first gate contact is located over the second transistor.

14. The integrated device of claim 1, wherein the first transistor includes a planar transistor, a field effect transistor (FET), or a gate all around (GAA) FET.

15. An integrated device comprising:
a substrate comprising:
a first active region, a second active region, and a field region located between the first active region and the second active region; and
a third active region, a fourth active region, and a second field region located between the third active region and the fourth active region; and
a first transistor located over the substrate, wherein the first transistor comprises the first active region and a gate;
a second transistor located over the substrate, wherein the second transistor comprises the second active region and the gate;
a first gate contact coupled to the gate of the first transistor and the second transistor, wherein the first gate contact is configured to be electrically coupled to an interconnect of the integrated device;
a second gate contact coupled to the gate,
wherein the second gate contact is located over the field region of the substrate, and
wherein the second gate contact is directly electrically coupled to only the gate,
a third transistor located over the substrate, wherein the third transistor comprises the third active region and a second gate;
a fourth transistor located over the substrate, wherein the fourth transistor comprises the fourth active region and the second gate;
a third gate contact coupled to the second gate of the third transistor and the fourth transistor, wherein the third gate contact is configured to be electrically coupled to another interconnect of the integrated device; and,
a fourth gate contact coupled to the second gate, wherein the fourth gate contact is directly electrically coupled to only the second gate,
wherein the third gate contact and the fourth gate contact are located over the third active region of the substrate or the fourth active region of the substrate.

16. The integrated device of claim 15, wherein the integrated device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

17. The integrated device of claim 15, wherein the first transistor includes a planar transistor, a field effect transistor (FET), or a gate all around (GAA) FET.

18. An apparatus comprising:
a substrate comprising a first active region, a second active region, and a field region located between the first active region and the second active region;
a first transistor located over the substrate, wherein the first transistor comprises the first active region and a gate;
a second transistor located over the substrate, wherein the second transistor comprises the second active region and the gate
a first gate contact coupled to the gate of the first transistor and the second transistor, wherein the first gate contact is configured to be electrically coupled to an interconnect of the integrated device; and
means for tuning a threshold voltage required to induce a first current flow in the first transistor, wherein the means for tuning is directly electrically coupled to only the gate,
wherein the first gate contact and the means for tuning the threshold voltage are located over the first active region.

19. The apparatus of claim 18, further comprising a third gate contact coupled to the gate.

20. The apparatus of claim 18, wherein the means for tuning a threshold voltage is configured to tune a threshold voltage required to induce the first current flow in the first transistor and a second current flow in the second transistor.

21. The apparatus of claim 20, wherein the first transistor includes a p-channel field effect transistor (PFET) and the second transistor includes a n-channel field effect transistor (NFET).

22. The apparatus of claim 20, wherein the first transistor includes a n-channel field effect transistor (NFET) and the second transistor includes a p-channel field effect transistor (PFET).

23. The apparatus of claim 18, wherein the means for tuning a threshold voltage includes a dummy gate contact.

24. The apparatus of claim 18, wherein the means for tuning a threshold voltage includes a dummy contact interconnect.

25. An integrated device comprising:
a substrate comprising a first active region, a second active region, and a field region located between the first active region and the second active region;
a first transistor located over the substrate, wherein the first transistor comprises the first active region and a gate;
a second transistor located over the substrate, wherein the second transistor comprises the second active region and the gate;
a first gate contact coupled to the gate of the first transistor and the second transistor, wherein the first gate contact is configured to be electrically coupled to an interconnect of the integrated device;
a second gate contact coupled to the gate; and
a contact interconnect coupled to the second gate contact, wherein the contact interconnect is directly electrically coupled to only the gate contact,
wherein the first gate contact, the second gate contact and the contact interconnect are located over the first active region of the substrate.

26. The integrated device of claim 25, further comprising a third gate contact coupled to the gate.

27. The integrated device of claim 25, wherein the second gate contact is configured to tune a threshold voltage required to induce a first current flow in the first transistor and a second current flow in the second transistor.

28. The integrated device of claim 27, wherein the first transistor includes a p-channel field effect transistor (PFET) and the second transistor includes a n-channel field effect transistor (NFET).

29. The integrated device of claim 27, wherein the first transistor includes a n-channel field effect transistor (NFET) and the second transistor includes a p-channel field effect transistor (PFET).

30. The integrated device of claim 25,
wherein the substrate further comprises a third active region, a fourth active region, and a second field region located between the third active region and the fourth active region, and
wherein the integrated device further comprises:
- a third transistor located over the substrate, wherein the third transistor comprises the third active region and a second gate;
- a fourth transistor located over the substrate, wherein the fourth transistor comprises the fourth active region and the second gate;
- a third gate contact coupled to the second gate of the third transistor and the fourth transistor, wherein the third gate contact is configured to be electrically coupled to another interconnect of the integrated device; and
- a fourth gate contact coupled to the second gate, wherein the fourth gate contact is directly electrically coupled to only the second gate,
wherein the third gate contact and the fourth gate contact are located over the third active region of the substrate or the fourth active region of the substrate.

31. A method for fabricating an integrated device, comprising:
providing a substrate comprising a first active region, a second active region, and a field region located between the first active region and the second active region;
forming a first transistor over the substrate, wherein the first transistor comprises the first active region and a gate;
forming a second transistor over the substrate, wherein the second transistor comprises the second active region and the gate;
forming a first gate contact over the gate of the first transistor and the second transistor, wherein the first gate contact is configured to be electrically coupled to an interconnect of the integrated device; and
forming a second gate contact over the gate, wherein the second gate contact is directly electrically coupled to only the gate,
wherein the first gate contact and the second gate contact are formed such that the first gate contact and the second gate contact are located over the first active region of the substrate.

32. The method of claim 31, further comprising forming a third gate contact over the gate such that the third gate contact is directly electrically coupled to only the gate.

33. The method of claim 31, wherein the second gate contact is configured to tune a threshold voltage required to induce a first current flow in the first transistor and a second current flow in the second transistor.

34. The method of claim 33, wherein the first transistor includes a p-channel field effect transistor (PFET) and the second transistor includes a n-channel field effect transistor (NFET).

* * * * *